(12) United States Patent
Choi et al.

(10) Patent No.: US 12,389,754 B2
(45) Date of Patent: Aug. 12, 2025

(54) DISPLAY DEVICE

(71) Applicant: LG Display Co., Ltd., Seoul (KR)

(72) Inventors: Kwang Yong Choi, Paju-si (KR); In Hyo Han, Paju-si (KR); Dong Yoon Lee, Paju-si (KR); Hyun Dong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 538 days.

(21) Appl. No.: 17/553,361

(22) Filed: Dec. 16, 2021

(65) Prior Publication Data

US 2022/0190081 A1    Jun. 16, 2022

(30) Foreign Application Priority Data

Dec. 16, 2020   (KR) ........................ 10-2020-0176389

(51) Int. Cl.
| | |
|---|---|
| *H10K 59/123* | (2023.01) |
| *H10D 86/40* | (2025.01) |
| *H10D 86/60* | (2025.01) |
| *H10K 50/818* | (2023.01) |
| *H10K 59/12* | (2023.01) |
| *H10K 59/121* | (2023.01) |
| *H10K 59/124* | (2023.01) |
| *H10K 59/131* | (2023.01) |
| *H10K 59/80* | (2023.01) |
| *H10K 59/88* | (2023.01) |
| *H10K 71/00* | (2023.01) |

(52) U.S. Cl.
CPC ......... *H10K 59/123* (2023.02); *H10K 50/818* (2023.02); *H10K 59/1213* (2023.02); *H10K 59/131* (2023.02); *H10K 59/80518* (2023.02); *H10K 71/00* (2023.02); *H10D 86/441* (2025.01); *H10D 86/60* (2025.01); *H10K 59/1201* (2023.02); *H10K 59/124* (2023.02); *H10K 59/80521* (2023.02); *H10K 59/88* (2023.02); *H10K 71/861* (2023.02)

(58) Field of Classification Search
None
See application file for complete search history.

(56) References Cited

U.S. PATENT DOCUMENTS

| | | | | |
|---|---|---|---|---|
| 2009/0001360 | A1* | 1/2009 | Nakayama | H10D 86/451 257/43 |
| 2016/0293888 | A1* | 10/2016 | Shim | H10K 59/1315 |
| 2016/0315133 | A1* | 10/2016 | Sato | H10K 59/122 |
| 2019/0035773 | A1* | 1/2019 | Lo | H10H 20/852 |
| 2019/0229152 | A1* | 7/2019 | Wang | H10K 59/80522 |
| 2024/0032352 | A1* | 1/2024 | Cao | H10K 59/8792 |

FOREIGN PATENT DOCUMENTS

| | | |
|---|---|---|
| KR | 10-2016-0031406 A | 3/2016 |
| KR | 10-2017-0078969 A | 7/2017 |
| KR | 10-2020-0048890 A | 5/2020 |

* cited by examiner

*Primary Examiner* — Nishath Yasmeen
(74) *Attorney, Agent, or Firm* — Birch, Stewart, Kolasch & Birch, LLP

(57) ABSTRACT

Discussed is a display device including a gate electrode, a gate insulating film disposed on the gate electrode, a semiconductor layer disposed on the gate insulating film, an insulating layer disposed on the semiconductor layer, a first electrode disposed on the insulating layer, a light-emitting layer disposed on the first electrode, and a second electrode disposed on the light-emitting layer.

8 Claims, 17 Drawing Sheets

DISPLAY DEVICE

CROSS-REFERENCE TO RELATED APPLICATION

This application claims priority to Korean Patent Application No. 10-2020-0176389, filed on Dec. 16, 2020 in the Republic of Korea, the contents of which are hereby expressly incorporated by reference in its entirety into the present application.

BACKGROUND

1. Field of Technology

The embodiments of the present disclosure relate to a display device.

2. Discussion of Related Art

Electroluminescence display devices can be classified into inorganic light-emitting display devices and organic light-emitting display devices depending on the materials of a light-emitting layer. An active-matrix-type organic light-emitting display device includes an organic light-emitting diode (OLED) that emits light by itself and has advantages such as a quick response time, high luminous efficiency, high luminance, and a wide viewing angle. Also, the active-matrix-type organic light-emitting display device can express a black grayscale as perfect black and thus is excellent in contrast ratio and color gamut.

An organic light-emitting display device does not require a backlight unit and can be implemented on a plastic substrate, a thin glass substrate, or a metal substrate, which is a flexible material. Accordingly, a flexible display can be implemented with the organic light-emitting display device.

Such an organic light-emitting display device can display an image by arranging a plurality of sub-pixels in a matrix form on a display panel and controlling the brightness represented by the sub-pixels. In addition, a light-emitting element, a circuit element for driving the light-emitting element, and the like can be disposed in each of the sub-pixels.

However, in a conventional display device, there can be a limitation in that it may be difficult to increase an aperture ratio of sub-pixels due to circuit elements disposed in the sub-pixels and thus, there may be limitations in implementing a high-resolution display device.

SUMMARY OF THE DISCLOSURE

An embodiment of the present disclosure is directed to providing a display device capable of increasing an aperture ratio of pixels, and providing an improved display device which addresses the limitations and disadvantages associated with the related art.

An embodiment is also directed to providing a display device capable of removing an afterimage and lowering power consumption.

It should be noted that objects of the present disclosure are not limited to the above-described object, and other objects of the present disclosure will be apparent to those skilled in the art from the following descriptions.

According to an aspect of the present disclosure, there is provided a display device including a gate electrode, a gate insulating film disposed on the gate electrode, a semiconductor layer disposed on the gate insulating film, an insulating layer disposed on the semiconductor layer, a first electrode disposed on the insulating layer, a light-emitting layer disposed on the first electrode, and a second electrode disposed on the light-emitting layer.

The insulating layer can include a through hole having an inner side wall to which a low-potential voltage line extends, and the second electrode can extend to the through hole and can be electrically connected to the low-potential voltage line.

The low-potential voltage line can include a first line area formed on a lower surface of the insulating layer and a second line area extending to the inner side wall of the through hole.

A width of the through hole can increase from the second electrode toward the first electrode. The second electrode can extend to the inner side wall of the through hole and can be electrically connected to the second line area.

The light-emitting layer can include an extending portion extending to the inner side wall of the through hole.

The display device can include a metal pattern disposed between the first electrode and the semiconductor layer, and the metal pattern can be electrically connected to the first electrode.

The first electrode can include a plurality of first electrodes respectively corresponding to a plurality of sub-pixels, and the insulating layer can include a plurality of sub-through holes disposed between the plurality of first electrodes.

The plurality of sub-through holes can extend in a length direction of the plurality of first electrodes. The display device can include a blocking layer disposed on the plurality of sub-through holes, and the blocking layer can be a dummy line of the low-potential voltage line.

The display device can include an interlayer insulating film disposed below the insulating layer, a metal pattern disposed between the insulating layer and the first electrode, and a source electrode and a drain electrode disposed below the interlayer insulating film, and the drain electrode can be electrically connected to the metal pattern through the insulating layer and the interlayer insulating film.

The display device can include a metal pattern disposed between the insulating layer and the first electrode, and a source electrode and a drain electrode disposed below the gate insulating film, and the drain electrode can be electrically connected to the metal pattern through the insulating layer and the gate insulating film.

According to another aspect of the present disclosure, there is provided a display device including a driving element, an insulating layer disposed on the driving element, a first electrode disposed on the insulating layer, a light-emitting layer disposed on the first electrode, and a second electrode disposed on the light-emitting layer, wherein the insulating layer can include a through hole having an inner side wall on which a low-potential voltage line is formed, and the second electrode can extend to the through hole and can be electrically connected to the low-potential voltage line.

The driving element can include a semiconductor layer disposed below the metal pattern, a gate insulating film disposed below the semiconductor layer, and a gate electrode disposed below the gate insulating film.

The display device can include a substrate and a planarization layer disposed on the substrate, wherein the driving element can be disposed on the planarization layer, and the planarization layer can include a protrusion inserted into the through hole.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF THE EMBODIMENTS

Figure 1:
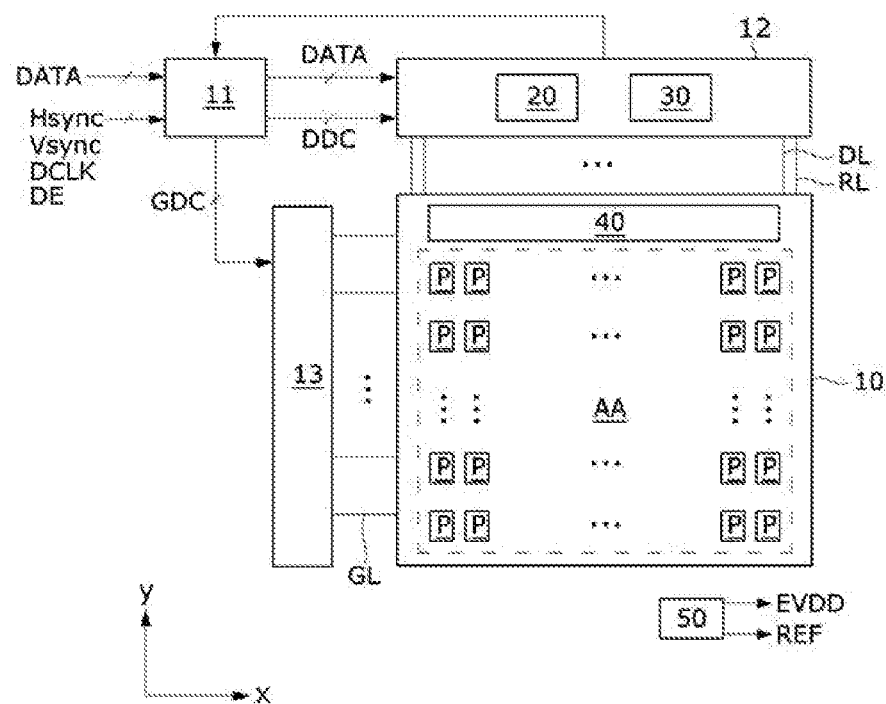
FIG. 1 is a schematic block diagram illustrating a display device according to one embodiment of the present disclosure.

Advantages and features of the present disclosure and implementation methods thereof will be clarified through the following embodiments described with reference to the accompanying drawings. However, the present disclosure is not limited to the embodiments described below and can be implemented with a variety of different modifications. The embodiments are merely provided to allow those skilled in the art to completely understand the scope of the present disclosure, and the present disclosure is defined only by the scope of the claims.

The figures, dimensions, ratios, angles, numbers, and the like disclosed in the drawings for describing the embodiments of the present disclosure are merely illustrative and thus the present disclosure is not limited to matters illustrated in the drawings. Throughout the specification, like reference numerals refer to substantially like components. Further, in describing the present disclosure, detailed descriptions of well-known technologies may be omitted or may be provided briefly when it is determined that they can unnecessarily obscure the gist of the present disclosure.

Terms such as "including," "having," and "composed of" used herein are intended to allow other elements to be added unless the terms are used with the term "only." Any references to the singular can include the plural unless expressly stated otherwise.

Components are interpreted to include an ordinary error range even if not expressly stated.

For a description of a positional relationship, for example, when the positional relationship between two components is described as "on," "above," "below," "next to," and the like, one or more components can be interposed therebetween unless the term "immediately" or "directly" is used in the expression.

Although the terms first, second, and the like are used to distinguish the components, the functions or structures of these components are not limited by the ordinal number before the component or the name of the component.

The following embodiments can be partially or entirely coupled to or combined with each other and can be interoperated and performed in technically various ways. Each of the embodiments can be independently operable with respect to each other and can be implemented together in related relationships.

A pixel circuit and a display panel driving unit of the present disclosure can include transistors formed on a pixel array. The transistors can be implemented as oxide thin-film transistors (TFTs) including an oxide semiconductor, low-temperature polysilicon (LTPS) TFTs including LTPS, and the like. Further, each of the transistors can be implemented as a p-channel transistor or an n-channel transistor.

A driving element of the pixel circuit can be implemented as a transistor. The driving element should have uniform electrical characteristics between all the pixels, but there can be differences in electrical characteristics between the pixels due to a process variation and an element characteristic variation, and the electrical characteristics can vary as a display driving time passes. In order to compensate for the electrical characteristic variation of the driving element, the display device can include an external compensation circuit. The external compensation circuit senses a threshold voltage and/or mobility of the driving element through a switch element for sensing of each pixel circuit and a reference voltage line (hereinafter referred to as a "REF line") connected to the switch element and transmits the sensed threshold voltage and/or mobility to an external compensation unit. The compensation unit modulates pixel data of an input image by reflecting the sensing result of each of sub-pixels, thereby compensating for changes in electrical characteristics of the driving element.

Hereinafter, a display device according to embodiments of the present disclosure will be described with reference to the accompanying drawings. All the components of each display device according to all embodiments of the present disclosure are operatively coupled and configured. Further, the display device according to the embodiments of the present disclosure can be flexible display devices of various types and configurations, having a wide range of applications.

Throughout the specification, like reference numerals refer to substantially like components. In the following description, when it is determined that the detailed description of known functions or configurations associated with the present specification can unnecessarily obscure the gist of the present disclosure, the detailed description thereof will be omitted or briefly described.

Figure 2:
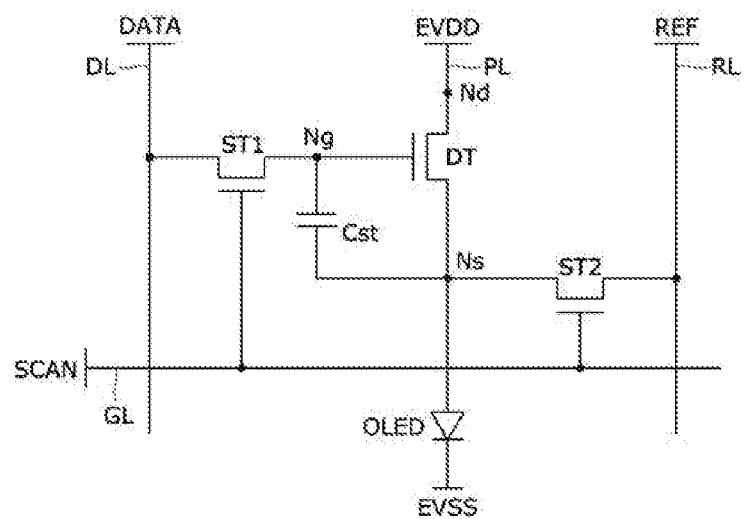
FIG. 2 is a circuit diagram illustrating an example of a pixel circuit.

FIG. 1 is a schematic block diagram illustrating a display device according to one embodiment of the present disclosure, and FIG. 2 is a circuit diagram illustrating an example of a pixel circuit.

Referring to FIGS. 1 and 2, the display device of the present disclosure includes a display panel 10 and a display panel driving unit for writing pixel data to pixels of the display panel 10.

The display panel driving unit includes a source driver 12, a gate driver 13, and a timing controller 11.

A screen of the display panel 10 includes a pixel array AA that displays an input image. A plurality of data lines DL, a plurality of gate lines GL crossing the data lines DL, a plurality of REF lines RL parallel to the data lines DL, and a plurality of pixels P disposed in a matrix form are disposed in the pixel array AA.

The data lines DL and the REF lines RL can be formed on the display panel 10 as metal lines elongated along a first direction (e.g., y-axis direction). The gate lines GL can be formed on the display panel 10 as metal lines elongated along a second direction (e.g., x-axis direction) crossing the first direction (y-axis direction).

Each of pixels P can be divided into a red sub-pixel, a green sub-pixel, and a blue sub-pixel for color implementation. Each of the pixels can further include a white sub-pixel. Each of the sub-pixels can include a pixel circuit illustrated in FIG. 2.

Each of the sub-pixels is connected to one of the data lines DL through which a data voltage is supplied, one of the REF lines RL through which a reference voltage Vref is supplied, and one of the gate lines GL. In addition, each of the sub-pixels is connected to a VDD line PL through which a pixel driving voltage EVDD is supplied and receives a low-potential power supply voltage EVSS through a VSS electrode.

The display panel 10 can further include a switch unit 40. The switch unit 40 can include channels through which data voltages are output from a data driving unit 20, and a demultiplexer (DEMUX) connected between the data lines DL. The demultiplexer can reduce the number of channels of the source driver 12 by time-divisionally distributing the data voltage output through one channel of the source driver 12 to two or more data lines DL.

The source driver 12 includes the data driving unit 20 configured to supply the data voltage to the data lines DL of the display panel 10, and a sensing unit 30 connected to the pixel circuit of each of the sub-pixels to sense a driving characteristic of the pixel circuit in real time.

The data driving unit 20 includes a plurality of digital-to-analog converters (hereinafter referred to as a "DAC") respectively disposed in the channels. In a display mode, the DAC of the data driving unit 20 converts pixel data DATA received from the timing controller 11 into a gamma compensation voltage for each grayscale to output a data voltage Vdata. In a sensing mode, the data driving unit 20 outputs the data voltage Vdata for sensing under the control of the timing controller 11. The data voltage Vdata, which is output through each of the channels of the data driving unit 20, can be directly applied to the data lines DL or can be applied to the data lines DL through the switch unit 40.

The sensing unit 30 includes a sampling circuit and an integrator connected to the REF line RL, and an analog-to-digital converter (hereinafter referred to as an "ADC") configured to convert an output voltage of the integrator into sensing data (digital data). The sensing data is transmitted to a compensation unit of the timing controller 11.

The gate driver 13 can be implemented as a gate-in-panel (GIP) circuit that is directly formed on a bezel area on the display panel 10 together with a TFT array of the pixel array. The gate driver 13 outputs a gate signal to the gate lines GL under the control of the timing controller 11.

The gate driver 13 can shift the gate signal using a shift register to sequentially supply the resultant signals to the gate lines GL. A voltage of the gate signal swings between a gate-off voltage and a gate-on voltage. The gate driver 13 can be disposed at each of left and right bezels of the display panel 10 to supply the gate signal to the gate lines GL using a double feeding method. The double feeding method allows the gate drivers 13 at both sides of the display panel 10 to be synchronized under the control of the timing controller 11 so that the gate signals can be simultaneously applied to both ends of one gate line. In another embodiment, the gate driver 13 can be disposed on one side of the left and right bezels of the display panel 10 to supply the gate signal to the gate lines GL using a single feeding method.

The timing controller 11 modulates pixel data of an input image on the basis of the sensing data received from the sensing unit 30, transmits the modulated pixel data to the data driving unit 20 of the source driver 12, and controls the data driving unit 20 and the gate driver 13.

The timing controller 11 receives pixel data of an input image and a timing signal synchronized with the pixel data from a host system. The timing signal can include a vertical synchronization signal Vsync, a horizontal synchronization signal Hsync, a main clock DCLK, a data enable signal DE, and the like. One period of the vertical synchronization signal Vsync is one frame period. One period of each of the horizontal synchronization signal Hsync and the data enable signal DE is one horizontal period 1H. A pulse of the data enable signal DE is synchronized with one piece of line data to be written to the pixels of one pixel line. Since a frame period and a horizontal period can be obtained through a method of counting the data enable signal DE, the vertical synchronization signal Vsync and the horizontal synchronization signal Hsync can be omitted.

The timing controller 11 can multiply an input frame frequency by i times and generate control signals DDC and GDC for controlling an operation timing of each of the source driver 12, the gate driver 13, the switch unit 40, and the like at a frame frequency of input frame frequency*i Hz (where i is an integer greater than 0). The input frame frequency is 60 Hz in the National Television Standards Committee (NTSC) scheme and 50 Hz in the Phase-Alternating Line (PAL) scheme. In order to lower a refresh rate of pixels in a low-speed driving mode, the timing controller 11 can lower the frame frequency into a frequency ranging from 1 Hz to 30 Hz.

A voltage level of a gate timing control signal output from the timing controller 11 can be shifted by a level shifter. The gate timing control signal can include a start pulse, a shift clock, and the like. The level shifter can convert a low-level voltage of the gate timing control signal into a gate low voltage and convert a high-level voltage of the gate timing control signal into a gate high voltage. The shift register of the gate driver 13 receives the gate timing control signal to generate a gate signal and shifts the gate signal.

The timing controller 11 can control the sensing mode for sensing electrical characteristics of a driving element DT in each of the sub-pixels and updating a compensation value according to the sensing result, and the display mode for displaying pixel data of an input image, to which the compensation value is reflected. The timing controller 11 can control the display panel driving units 12, 13, and 40 to separate the sensing mode and the display mode according to a predetermined sequence, but the present disclosure is not limited thereto. For example, the sensing mode can be performed in a vertical blank period of the display mode, in which the input image is displayed on the pixels, can be performed in a power-on sequence period in which power is applied to the display device, or can be performed in a power-off sequence period before power is completely discharged after the power of the display device is cut off.

The vertical blank period is a period in which the pixel data DATA of the input image is not written to the pixels. The vertical blank period is allocated between vertical active intervals in which the pixel data DATA of one frame is written. The power-on sequence period includes a transition period until the input image is displayed on the pixel array AA after the power of the display device starts to be applied. The power-off sequence period includes a transition period until the power of the display device is completely cut off after data addressing of the pixels is completed.

The compensation unit of the timing controller 11 can include a compensation look-up table. In the look-up table, compensation values for compensating for a threshold voltage Vth and a mobility μ of the driving element DT for each sub-pixel are stored. The compensation unit compensates for changes in electrical characteristics of the driving element DT in each of the sub-pixels by inputting sensing data, which is received from the ADC of the sensing unit 30, into the compensation look-up table, adding or multiplying the compensation value output from the compensation look-up table to the pixel data of the input image, and modulating the pixel data.

The host system can be one of a television system, a set-top box, a navigation system, a personal computer (PC), a home theater system, a mobile device, a wearable device, and a vehicle system.

The display device further includes a power supply unit 50. The power supply unit 50 can include a charge pump, a regulator, a buck converter, a boost converter, a programmable gamma integrated circuit (IC), and the like.

The power supply unit 50 adjusts a DC input voltage received from the host system to generate power required for driving the display panel driving unit and the display panel 10. The power supply unit 50 can output DC voltages such as a gamma reference voltage, a gate low voltage, a gate high voltage, a pixel driving voltage EVDD, a low-potential power supply voltage EVSS, and a reference voltage REF. A pulse of the gate signal swings between the gate high voltage and the gate low voltage. The gamma reference voltage is applied to a voltage dividing circuit of the data driving unit 20. The voltage dividing circuit divides the gamma reference voltage and outputs a gamma compensation voltage for each grayscale. The gamma compensation voltage for each grayscale is provided to the DAC of the data driving unit 20. The programmable gamma IC can change a voltage level of each gamma reference voltage according to a register setting value.

FIG. 2 is a circuit diagram illustrating an example of the pixel circuit.

As shown in FIG. 2, the pixel circuit is connected to the data line DL through which the data voltage of the pixel data DATA is supplied, the REF line RL through which the reference voltage REF is supplied, and the gate line GL through which a gate signal SCAN is supplied. The reference voltage REF can be set to a DC voltage that is less than the pixel driving voltage EVDD and less than or equal to the low-potential power supply voltage EVSS.

The pixel circuit includes a light-emitting element OLED, a driving element DT, a first switch element ST1, a second switch element ST2, and a storage capacitor Cst. Each of the driving element DT and the switching elements ST1 and ST2 can be implemented as a transistor.

The light-emitting element OLED can be implemented as an OLED including an organic compound layer formed between an anode and a cathode. The organic compound layer can include, but is not limited to, a hole injection layer HIL, a hole transport layer HTL, a light-emitting layer EML, an electron transport layer ETL, an electron injection layer EIL, and the like. The light-emitting element OLED is connected between a third node Ns, which is connected to a source electrode of the driving element DT, and the low-potential power supply voltage EVSS. The light-emitting element OLED emits light by being driven with a current generated due to a gate-source voltage Vgs of the driving element DT.

The driving element DT includes a gate electrode connected to a first node Ng, a drain electrode connected to a second node Nd, and a source electrode connected to the third node Ns. The source electrode of the driving element DT is connected to the anode of the light-emitting element OLED through the third node Ns. The driving element DT controls the amount of current, which is applied to the light-emitting element OLED according to the gate-source voltage Vgs, to drive the light-emitting element OLED. The pixel driving voltage EVDD can be applied to the drain electrode of the driving element DT.

The first switch element ST1 includes a gate electrode connected to the gate line GL, a drain electrode connected to the data line DL, and a source electrode connected to the first node Ng. The first switch element ST1 is turned on in response to a pulse of the gate signal SCAN received through the gate line GL. When the first switch element ST1 is turned on, the data line DL through which the data voltage of the pixel data DATA is applied is connected to the first node Ng to apply the data voltage to the gate electrode of the driving element DT and the storage capacitor Cst.

The second switch element ST2 includes a gate electrode connected to the gate line GL, a drain electrode connected to the REF line RL, and a source electrode connected to the third node Ns. The second switch element ST2 is turned on in response to a pulse of the gate signal SCAN received through the gate line GL to electrically connect the REF line RL and the third node Ns. When the second switch element ST2 is turned on, the reference voltage REF is applied to the third node Ns. In the sensing mode, when the second switch element ST2 is turned on, the electrical characteristics of the driving element DT can be sensed due to current flowing through the third node Ns. The REF line RL is connected to the sensing unit 30 to supply the current flowing through the third node Ns to the sensing unit 30.

The storage capacitor Cst is connected between the first node Ng and the third node Ns to maintain the gate-source voltage Vgs of the driving element DT during a light emission period of the pixel P. As the gate-source voltage Vgs increases, a driving current increases, and accordingly, the amount of light emission of the pixel P increases. The luminance of the pixel P increases in proportion to the voltage, which is applied to the first node Ng, for example, the magnitude of the data voltage Vdata.

Figure 3:
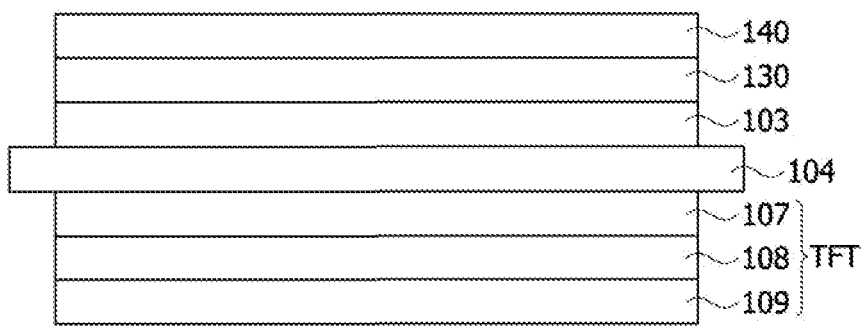
FIG. 3 is a block diagram of a display panel according to one embodiment of the present disclosure.
Figure 4:
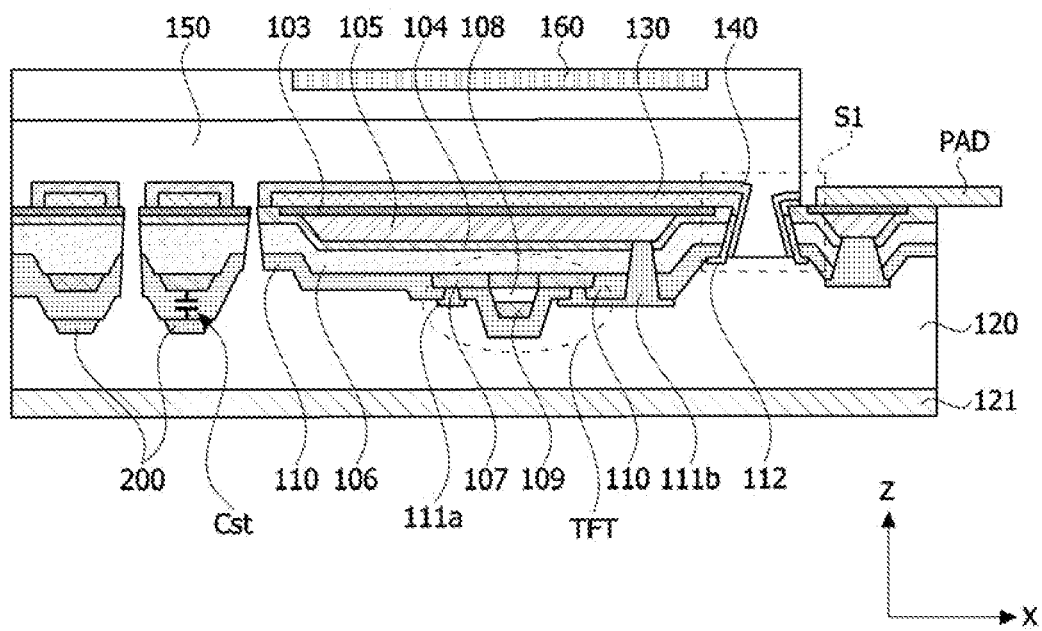
FIG. 4 is a conceptual diagram of the display panel according to one embodiment of the present disclosure.
Figure 5:
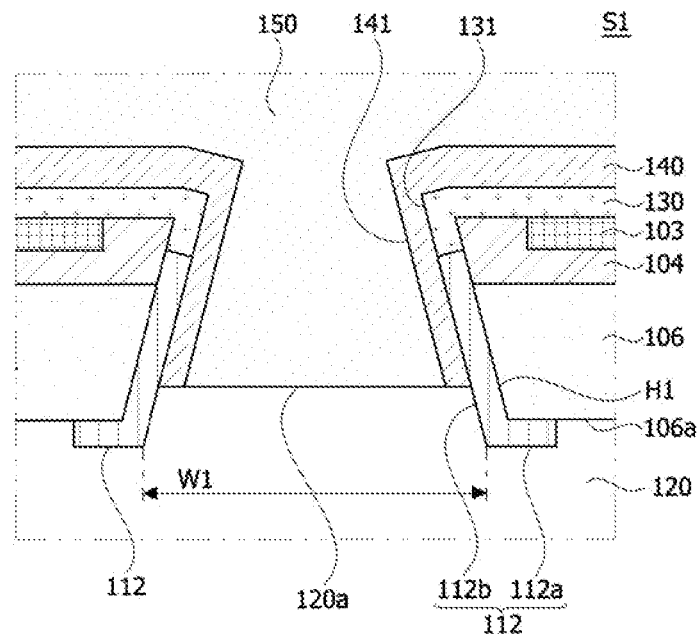
FIG. 5 is an enlarged view of portion S1 of FIG. 4.

FIG. 3 is a block diagram of a display panel according to one embodiment of the present disclosure, FIG. 4 is a conceptual diagram of a display panel according to one embodiment of the present disclosure, FIG. 5 is an enlarged view of portion S1 of FIG. 4, and FIGS. 6A to 6E are views illustrating various modified examples of FIG. 5.

Referring to FIG. 3, the display panel according to the embodiment can include a gate insulating film 108 disposed on a gate electrode 109, a semiconductor layer 107 disposed on the gate insulating film 108, an insulating layer 104 disposed on the semiconductor layer 107, a first electrode 103 disposed on the insulating layer 104, a light-emitting layer 130 disposed on the first electrode 103, and a second electrode 140 disposed on the light-emitting layer 130.

A gate insulating film and a gate electrode are sequentially formed on a semiconductor layer in a conventional display panel, but in the embodiment, the gate insulating film 108 and the semiconductor layer 107 are formed on the gate electrode 109, and thus the stacking order can be opposite to that of the conventional display panel. In the embodiment, a light-emitting element is formed on a rear surface of a thin-film transistor TFT after forming the thin-film transistor TFT, and thus the structure of the thin-film transistor TFT can be opposite to that of a conventional structure. Here, the thin-film transistor TFT can be the driving element DT (of FIG. 2), but the present disclosure is not necessarily limited thereto.

In the display panel according to the embodiment, the light-emitting element is formed on the rear surface of the thin-film transistor TFT so that an aperture ratio can be increased to be greater than or equal to 70%. Such a structure can have various advantages. Since the aperture ratio can be secured to be greater than or equal to 70%, ultra-high quality can be achieved with the performance of the current exposure apparatus, and afterimages can be effectively removed. In addition, power consumption can be reduced.

Referring to FIG. 4, the display panel can include a first planarization layer 120 disposed on a substrate 121, a thin-film transistor TFT disposed on the first planarization layer 120, a first electrode 103 disposed on the thin-film transistor TFT, a light-emitting layer 130 disposed on the first electrode 103, and a second electrode 140 disposed on the light-emitting layer 130.

The substrate 121 can perform a function of protecting the thin-film transistor TFT and the light-emitting layer 130. The substrate 121 can include an adhesive surface FSA and a metal surface FSM, but the present disclosure is not necessarily limited thereto. As an example, the substrate 121 can be made of a flexible material as well as a metal material. The substrate 121 can be a substrate that is separately bonded after manufacturing a thin-film transistor TFT rather than a growth substrate on which the thin-film transistor TFT is formed.

The first planarization layer 120 can be disposed on the substrate 121. A lower surface of the first planarization layer 120 can have a flat surface so that the substrate 121 can be adhered thereto. An upper surface of the first planarization layer 120 can support the thin-film transistor TFT and lines 200. The first planarization layer 120 can be made of an organic material such as polyimide, benzocyclobutene series resin, acrylate, and the like, but the present disclosure is not necessarily limited thereto.

The thin-film transistor TFT can include a gate electrode 109 disposed on an interlayer insulating film 110, a semiconductor layer 107 disposed on the gate electrode 109, a gate insulating film 108 disposed between the gate electrode 109 and the semiconductor layer 107, and a source electrode 111a and a drain electrode 111b connected to the semiconductor layer 107 through the interlayer insulating film 110.

The gate electrode 109 can be disposed below the gate insulating film 108. In addition, the gate insulating film 108 can be disposed below the semiconductor layer 107. The source electrode 111a and the drain electrode 111b can be disposed below the interlayer insulating film 110 and can be electrically connected to the semiconductor layer 107 through the interlayer insulating film 110. In addition, the drain electrode 111b can be electrically connected to a metal pattern 105 through the interlayer insulating film 110 and insulating layers 104 and 106.

A storage capacitor Cst can maintain a gate-source voltage Vgs of the thin-film transistor TFT during a light emission period of a pixel. As the gate-source voltage Vgs increases, a driving current increases, and accordingly, the amount of light emission of the pixel can increase.

The insulating layers 104 and 106 can include a second insulating layer 106 disposed on the semiconductor layer 107 and a first insulating layer 104 disposed on the second insulating layer 106. The first insulating layer 104 can be made of $SiN_x$ and the second insulating layer 106 can be made of $SiO_2$. A thickness of the second insulating layer 106 can be greater than that of the first insulating layer 104, but the present disclosure is not necessarily limited thereto.

The metal pattern 105 can be disposed on the first insulating layer 104. The metal pattern 105 can be made of APC (an alloy of silver, palladium, and copper), but the present disclosure is not necessarily limited thereto. The metal pattern 105 can perform a function of a reflective layer that reflects light emitted from the light-emitting layer 130 upward. In addition, the metal pattern 105 can perform a function of an anode together with the first electrode 103.

The first electrode 103 can be formed on the insulating layers 104 and 106. Since the first electrode is formed on the rear surface of the thin-film transistor TFT, the first electrode can be formed to have a flat surface.

The first electrode 103 can be made of a transparent electrode material such as indium tin oxide (ITO), indium zinc oxide (IZO), or zinc oxide (ZnO) but is not necessarily limited thereto and can be made of aluminum (Al), silver (Ag), magnesium (Mg), calcium (Ca), or an alloy thereof.

The light-emitting layer 130 can be formed on the first electrode 103. The light-emitting layer 130 can be formed on the rear surface of the thin-film transistor TFT like the first electrode 103 so that the light-emitting layer 130 can be formed to have a flat surface.

The light-emitting layer 130 can include a hole injection layer HIL, a hole transport layer HTL, an active layer EML, an electron transport layer ETL, an electron injection layer EIL, and the like as an organic compound layer. The structure of a general organic compound layer can be applied to the light-emitting layer 130 without limitation. The light-emitting layer 130 can be formed entirely on a display area, but the present disclosure is not necessarily limited thereto.

The second electrode 140 can be a cathode. The second electrode 140 can be formed entirely on a pixel area to be commonly connected between sub-pixels. The second electrode 140 can be a transparent electrode. As an example, the second electrode 140 can be made of a transparent electrode material such as indium tin oxide (ITO), indium zinc oxide (IZO), or zinc oxide (ZnO), but the present disclosure is not necessarily limited thereto.

A second planarization layer 150 can be formed on the second electrode 140 to planarize an upper surface thereof. The second planarization layer 150 can include an organic material such as polyimide, benzocyclobutene series resin, and acrylate.

A color filter 160 can be disposed on the second planarization layer 150 to control a color of light emitted from each pixel. As an example, white light can be emitted entirely through the light-emitting layer 130, and RGB colors can be implemented due to an RGB sub-filter areas of the color filter 160. A line can be electrically connected to a circuit board PAD at the outside of a light-emitting area.

Referring to FIG. 5, a low-potential voltage line 112 can be formed in a through hole H1 formed in the insulating layers 104 and 106. The low-potential voltage line 112 can include a first line area 112a formed on a lower surface 106a of the second insulating layer 106 and a second line area 112b extending to an inner side wall of the through hole H1.

The second line area 112b can extend to an upper end of the inner side wall of the through hole H1 but is not necessarily limited thereto and can be formed up to an intermediate point of the through hole H1. For example, the second line area 112b can extend, on the inner side wall of the through hole H1, to a height that allows the second line area 112b to be connected to the second electrode 140.

The through hole H1 is filled with the first planarization layer 120, but the first planarization layer 120 formed in the through hole H1 can be partially etched (undercut) by an undercut process, thereby exposing the second line area 112b.

At this point, a portion of the first planarization layer 120 that fills the through hole H1 can remain to form a protrusion 120a. A height of the protrusion 120a can be greater than that of a lower surface 106a of the second insulating layer 106 but is not necessarily limited thereto and can be adjusted according to a depth at which the protrusion 120a is etched.

The through hole H1 can have a shape (an inverted mesa shape) in which a width thereof increases in a first direction (a downward direction) toward the first electrode 103 from the second electrode 140. The through hole H1 is formed in the lower surface 106a of the second insulating layer and then is turned over, and in this state, the second electrode 140 is formed. Thus, the through hole H1 can have a shape in which an area thereof becomes larger toward a lower portion thereof.

The second electrode 140 can extend to the inner side wall of the through hole H1 and can be electrically connected to the second line area 112b of the low-potential voltage line 112. For example, the second line area 112b of the low-potential voltage line 112 and an extending portion 141 of the second electrode 140 can be connected to each other in the through hole H1.

The method of forming the second electrode 140 on the inner side wall of the through hole H1 is not particularly limited. Various electrode forming methods used in a semiconductor process can be applied to the second electrode 140 without limitation. As an example, the second electrode 140 can be formed using a coating, spraying, or evaporation method.

The light-emitting layer 130 can be disposed inside the through hole H1. As an example, a portion 131 of the light-emitting layer 130 can extend to an inner side of the through hole H1.

Figure 6A:
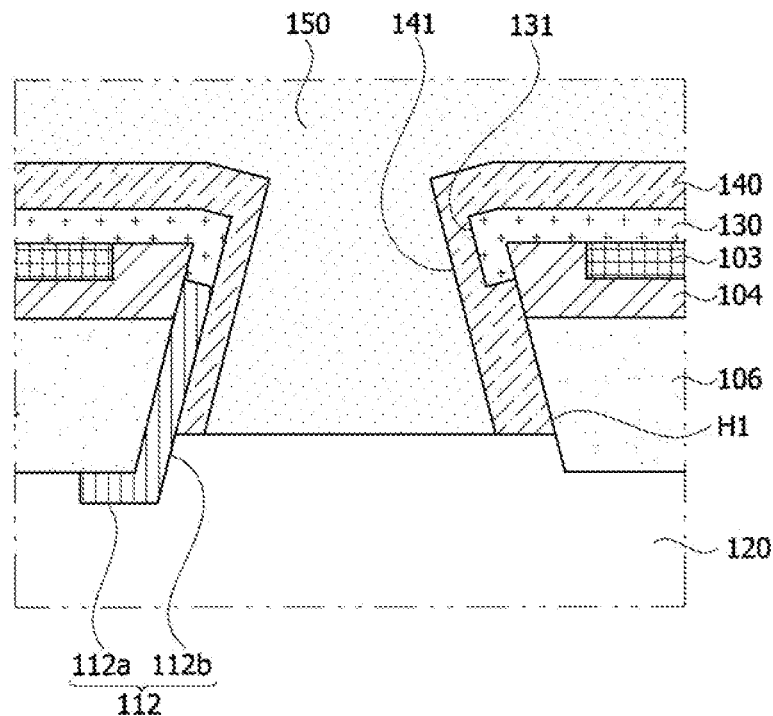
FIGS. 6A to 6E are views illustrating various modified examples of FIG. 5.

Referring to FIG. 6A, only a portion of the low-potential voltage line 112 can extend to the inner side of the through hole H1. In this case, the partially extending low-potential voltage line 112 can be electrically connected to the second electrode 140.

Figure 6B:
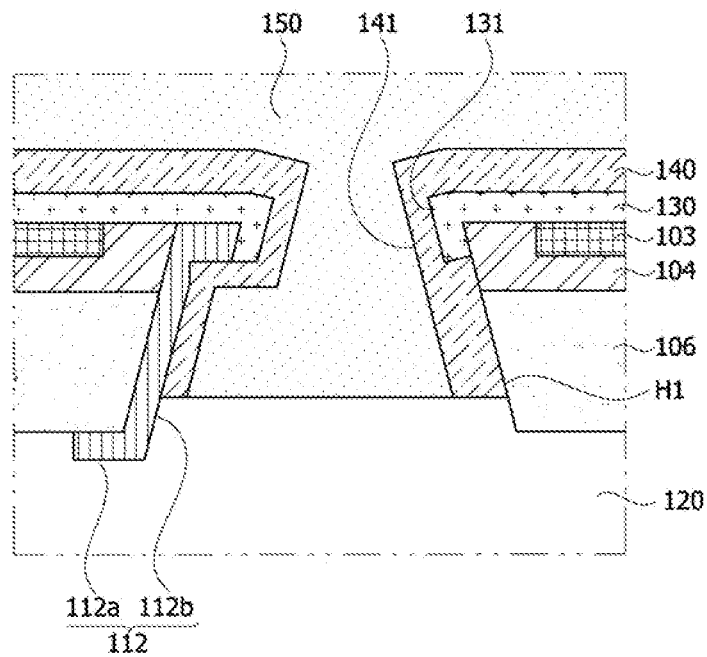

In addition, referring to FIG. 6B, in the through hole H1, an upper end of the second line area 112b can protrude in a horizontal direction. Accordingly, the light-emitting layer 130 and the second electrode 140 can also be formed along the protruding second line area 112b.

Figure 6C:
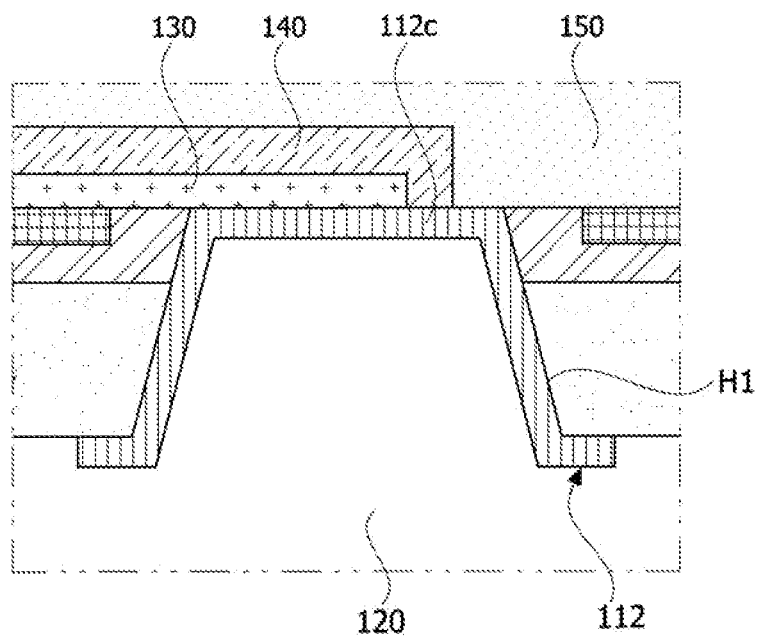

Referring to FIG. 6C, the low-potential voltage line 112 can be formed up to an upper surface of the through hole H1 to cover the through hole H1. In this case, the second electrode 140 can extend and be electrically connected to an upper surface 112c of the low-potential voltage line 112. Such a structure can be suitable for a display panel for a mobile device, in which the light-emitting layer 130 is formed using a fine metal mask (FMM).

Figure 6D:
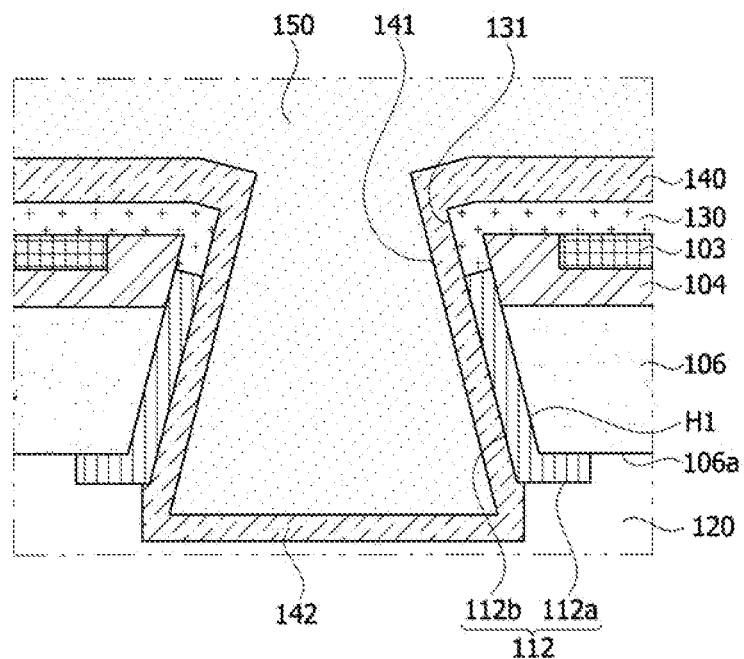

Referring to FIG. 6D, the second electrode 140 can include a bottom portion 142 formed on a bottom surface of the through hole H1 as well as an inner side wall thereof. Alternatively, the second electrode 140 can be filled in the through hole H1. Such a structure can improve electrical reliability with the low-potential voltage line 112 exposed to the through hole H1.

Figure 6E:
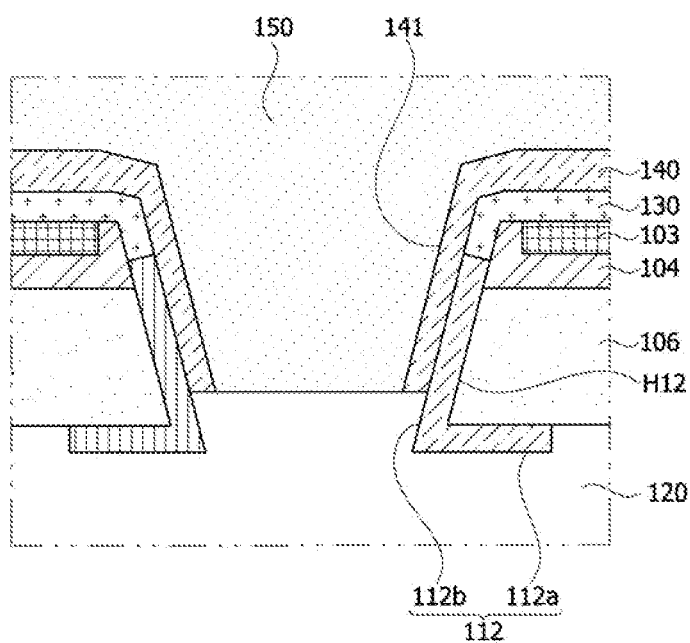

Referring to FIG. 6E, the through hole H1 can be formed such that an area thereof becomes smaller from the second electrode 140 toward the first electrode 103. According to such a structure, the second electrode 140 can be easily deposited to improve electrical reliability.

Figure 7:
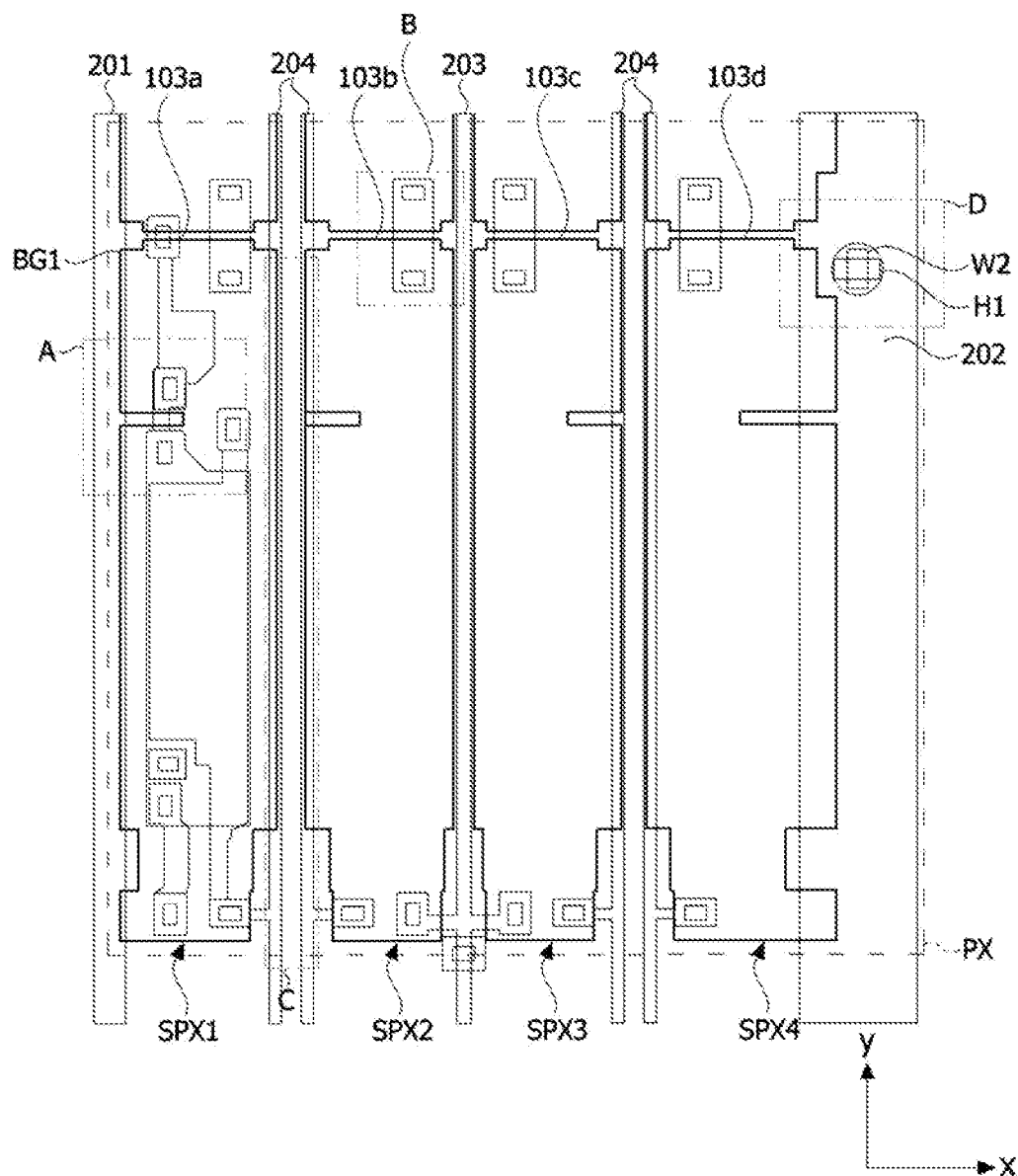
FIG. 7 is a view illustrating a pixel area.
Figure 8:
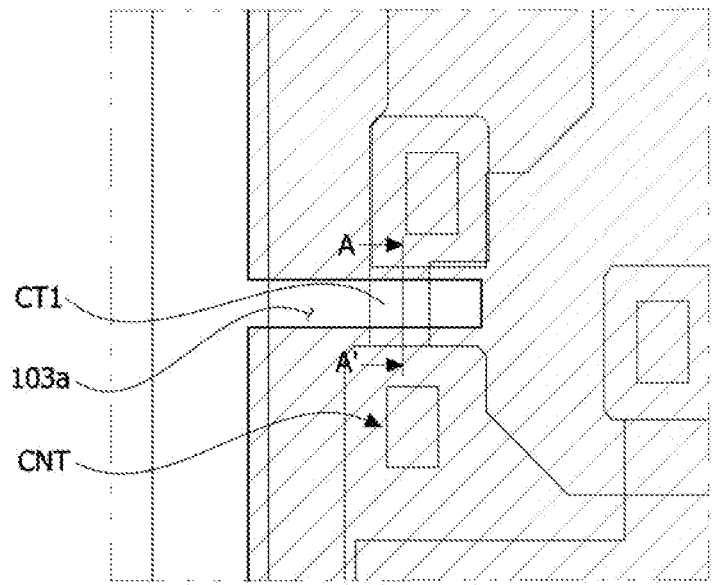
FIG. 8 is an enlarged view of area A of FIG. 7.
Figure 9:
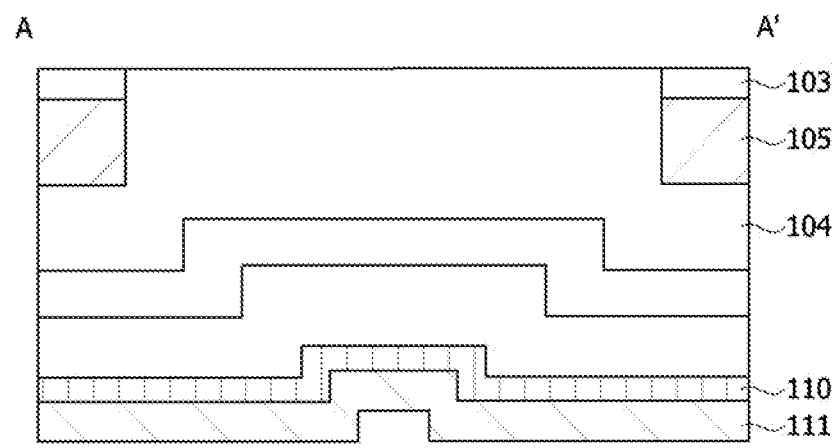
FIG. 9 is a cross-sectional view taken along line A-A' of FIG. 8.
Figure 10:
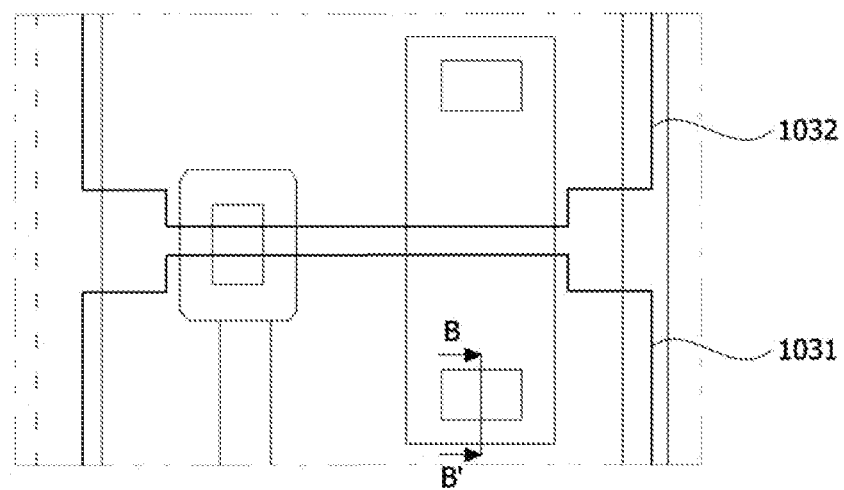
FIG. 10 is an enlarged view of area B of FIG. 7.
Figure 11:
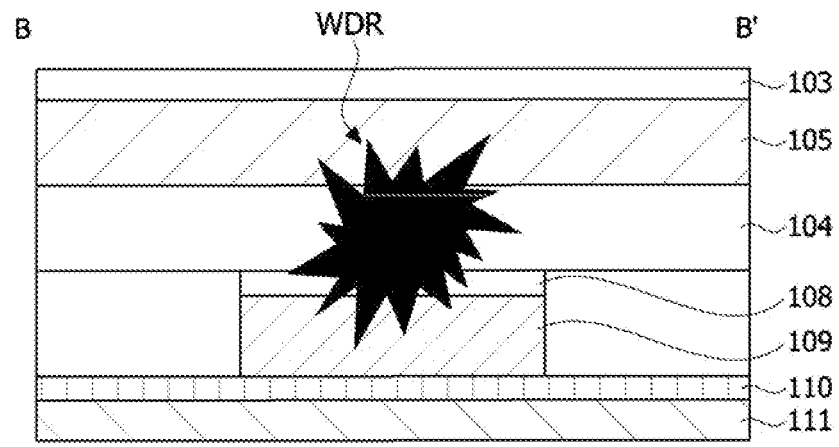
FIG. 11 is a cross-sectional view taken along line B-B' of FIG. 10.

FIG. 7 is a view illustrating a pixel area, FIG. 8 is an enlarged view of area A of FIG. 7, FIG. 9 is a cross-sectional view taken along line A-A' of FIG. 8, FIG. 10 is an enlarged view of area B of FIG. 7, and FIG. 11 is a cross-sectional view taken along line B-B' of FIG. 10.

Referring to FIG. 7, each pixel PX can include a plurality of sub-pixels SPX1, SPX2, SPX3, and SPX4. The first electrode 103 and the thin-film transistor TFT can be disposed in each of the plurality of sub-pixels SPX1, SPX2, SPX3, and SPX4, and the light-emitting layer can be formed entirely on the pixel.

Each pixel can be supplied with a high-potential driving power through the high-potential voltage line 201. In addition, a low-potential driving power can be supplied through the low-potential voltage line 112. A reference voltage line 203 through which the reference voltage REF is applied can be disposed between the high-potential voltage line 201 and the low-potential voltage line 112, and data lines 204 can be disposed between the high-potential voltage line 201 and the reference voltage line 203 and between the low-potential voltage line 112 and the reference voltage line 203.

The through hole H1 of the insulating layer can be disposed to overlap the low-potential voltage line 112 so that a portion of the low-potential voltage line 112 can be disposed in the through hole H1. Thereafter, when the second electrode 140 is formed entirely on each of the pixels, the second electrode 140 can extend to the inner side wall of the through hole H1 to be electrically connected to the low-potential voltage line 112.

Referring to FIGS. 8 and 9, a contact area CNT connected to the thin-film transistor TFT can be disposed below the first electrode 103, and the first electrode 103 can include a slit groove 103a through which a portion of a branch CT1 connected to the thin-film transistor TFT is exposed.

When the thin-film transistor TFT of the corresponding pixel is defective, the first electrode 103 can be separated from the gate electrode of the thin-film transistor TFT by irradiating and disconnecting the branch CT1 with a laser. Such a repair process can be performed to blacken the defective sub-pixel.

Conventionally, a contact area of the thin-film transistor TFT and the first electrode 103 is disposed on a side surface of the first electrode 103, and thus there is a problem that an aperture ratio is relatively decreased. However, according to the embodiment, since the contact area of the thin-film transistor TFT and the first electrode 103 is disposed below the first electrode 103, the aperture ratio can be increased. In addition, since a laser is not directly irradiated on the first electrode due to the slit groove 103a, it is possible to prevent the first electrode 103 from being damaged during repairing.

Referring to FIGS. 10 and 11, a connection pattern WDR can be disposed below two adjacent first electrodes 103. The two adjacent first electrodes 103 can be electrically insulated from the connection pattern WDR, which is disposed therebelow, due to the insulating layer, but when a laser is irradiated on welding points WP1 and WP2, the two adjacent first electrodes 103 can each be electrically connected to the connection pattern WDR. As a result, the two first electrodes 103 can be connected to each other through the connection pattern WDR.

As an example, when a defect occurs in a thin-film transistor of a first blue sub-pixel, the thin-film transistor of the first blue sub-pixel, which has the defect, can be electrically disconnected from a first electrode thereof, and the first electrode of the first blue sub-pixel can be connected to a first electrode of a second blue sub-pixel adjacent to the first blue sub-pixel using the connection pattern WDR. Thus, when power is applied to the first electrode of the second blue sub-pixel, the power can also be applied to the first electrode of the first blue sub-pixel.

The branches (cutting points) and the welding points WP1 and WP2 can have different positions or numbers depending on the structure, arrangement, and the like of the pixel. The cutting point can become any point that prevents current from being supplied from the thin-film transistor to the pixel, as well as the above-described points.

Figure 12:
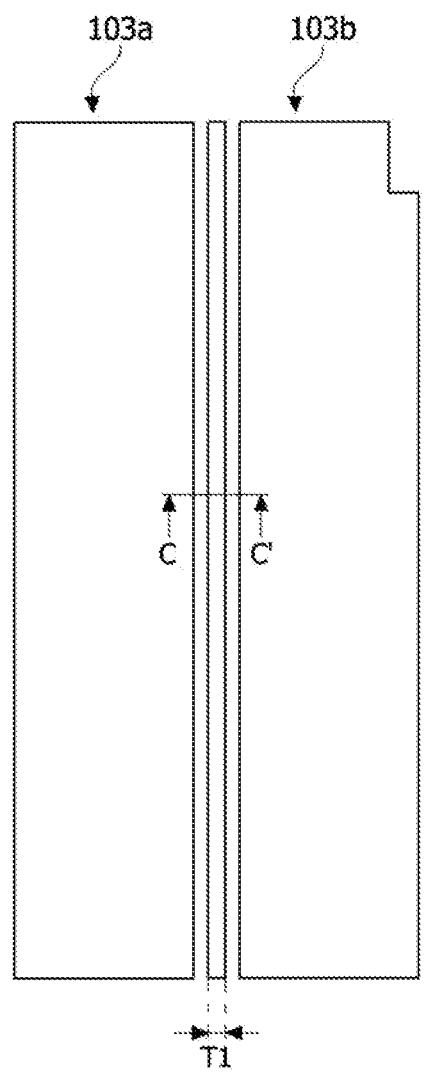
FIG. 12 is a view illustrating a state in which a blocking layer is disposed between a plurality of sub-pixels.
Figure 13:
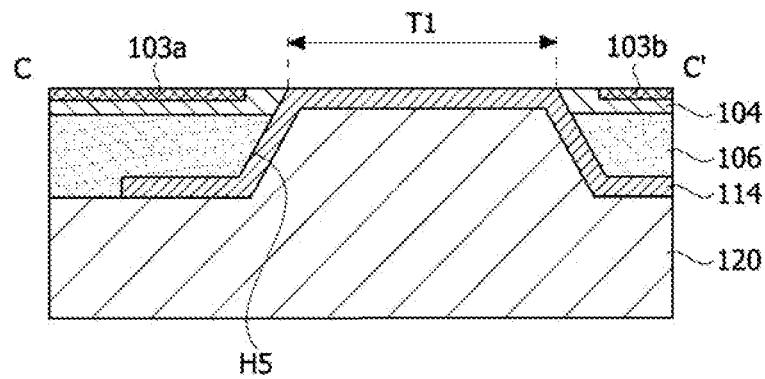
FIG. 13 is a cross-sectional view taken along line C-C' of FIG. 12.
Figure 14A:
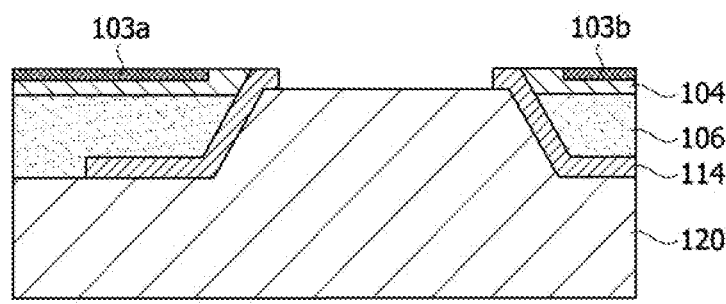
FIGS. 14A and 14B are views illustrating modified examples of FIG. 12.
Figure 14B:
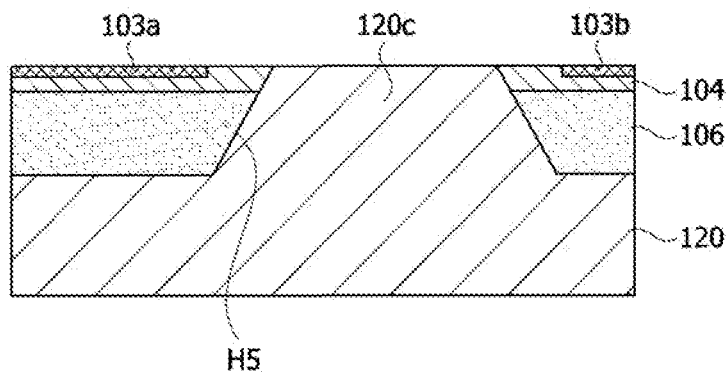

FIG. 12 is a view illustrating a state in which a blocking layer is disposed between a plurality of sub-pixels, FIG. 13 is a cross-sectional view taken along line C-C' of FIG. 12, and FIGS. 14A and 14B are views illustrating modified examples of FIG. 12.

Referring to FIGS. 12 and 13, a blocking layer 114 can be disposed between a plurality of first electrodes 103a and 103b connected to a plurality of sub-pixels. When the plurality of first electrodes 103a and 103b are disposed too close to each other, a lateral leakage current LLC may be generated when voltage is applied, and thus a problem in which an adjacent sub-pixel emits light may occur.

According to the embodiment, a leakage current can be blocked by disposing the blocking layer 114 between the first electrodes 103a and 103b.

The blocking layer 114 can be a dummy line of the low-potential voltage line 112 described above. For example, when the low-potential voltage line 112 is formed in the through hole H1 of the insulating layers 104 and 106, a third through hole H5 (sub-through hole) can also be formed between the plurality of first electrodes 103 and a dummy pattern can be formed thereon. A width T1 of the blocking layer 114 is not particularly limited. The blocking layer 114 can have an appropriate width that allows the blocking layer 114 to be disposed between the plurality of first electrodes 103.

Referring to FIG. 13, a current leaked from the adjacent first electrode 103 can be blocked by the blocking layer 114. The blocking layer 114 can have an upper electrode to shield an upper surface of the third through hole H5, but the present disclosure is not necessarily limited thereto. Referring to FIG. 14A, even when the upper electrode of the blocking layer 114 is partially removed, the lateral leakage current can be effectively removed. As shown in FIG. 14B, even when a protrusion 120c of the first planarization layer 120 is formed in the third through hole H5 without the separate blocking layer 114, the lateral leakage current can be reduced.

According to the embodiment, in a process of patterning to form the source electrode and the drain electrode, the through hole H1 for connecting the second electrode 140 and the low-potential voltage line 112, and the third through hole H5 for forming the blocking layer 114 between the plurality of first electrodes 103 can be simultaneously formed so that the process can be simplified.

Figure 15:
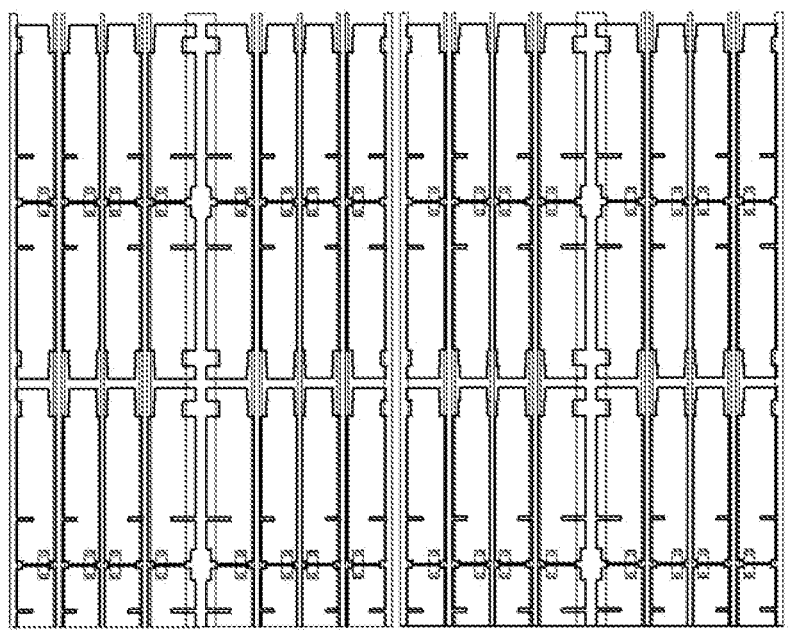
FIG. 15 is a view illustrating a structure in which a plurality of pixels are disposed.
Figure 16:
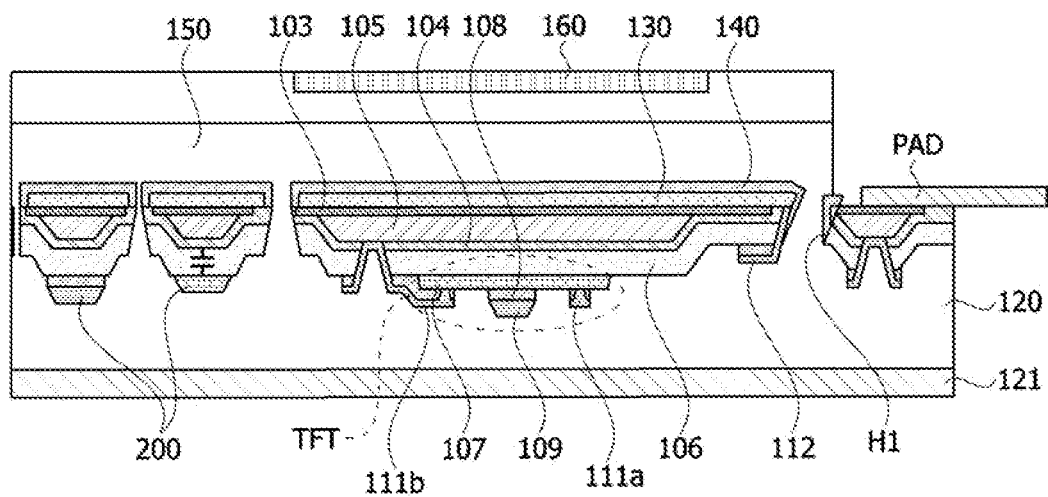
FIG. 16 is a conceptual diagram of a display panel according to another embodiment of the present disclosure.

FIG. 15 is a view illustrating a structure in which a plurality of pixels are disposed, and FIG. 16 is a conceptual diagram of a display panel according to another embodiment of the present disclosure.

Referring to FIG. 15, most circuit areas are disposed on a rear surface of a first electrode, and thus an aperture ratio can be greatly increased. Thus, a problem in which an afterimage is generated is reduced and power consumption is lowered.

A plurality of pixels PX1, PX2, PX3, and PX4 can be formed such that a plurality of first electrodes 103 are symmetrical to each other in a second direction (Y direction). As an example, when a first pixel PX1, a second pixel PX2, a third pixel PX3, and a fourth pixel PX4 are disposed in the second direction, a first electrode 103 of the first pixel PX1 and a first electrode 103 of the second pixel PX2 can be symmetrically formed and share one connection pattern WDR.

Thus, when the first electrode 103 of the first pixel PX1 is connected to the connection pattern WDR and the first electrode 103 of the second pixel PX2 is connected to the connection pattern WDR, the first electrode 103 of the first pixel PX1 and the first electrode 103 of the second pixel PX2 can be electrically connected to each other.

In the same manner, a first electrode 103 of the third pixel PX3 and a first electrode 103 of the fourth pixel PX4 can be symmetrically formed and share one connection pattern WDR.

Referring to FIG. 16, a display panel according to another embodiment of the present disclosure can include a first planarization layer 120 disposed on a substrate 121, a thin-film transistor TFT disposed on the first planarization layer 120, a first electrode 103 disposed on the thin-film transistor TFT, a light-emitting layer 130 disposed on the first electrode 103, and a second electrode 140 disposed on the light-emitting layer 130.

The substrate 121 can perform a function of protecting the thin-film transistor TFT and the light-emitting layer 130. The substrate 121 can include an adhesive surface FSA and a metal surface FSM, but the present disclosure is not necessarily limited thereto. As an example, the substrate 121 can be made of a flexible material as well as a metal material. The substrate 121 can be a substrate that is separately bonded after manufacturing a thin-film transistor TFT rather than a growth substrate on which the thin-film transistor TFT is formed.

The first planarization layer 120 can be disposed on the substrate 121. A lower surface of the first planarization layer 120 can have a flat surface so that the substrate 121 can be adhered thereto. An upper surface of the first planarization layer 120 can support the thin-film transistor TFT and lines 200. The first planarization layer 120 can be made of an organic material such as polyimide, benzocyclobutene series resin, acrylate, and the like, but the present disclosure is not necessarily limited thereto.

The thin-film transistor TFT can include a semiconductor layer 107 disposed on a gate electrode 109, a gate insulating film 108 disposed between the gate electrode 109 and the semiconductor layer 107, and a source electrode 111a and a drain electrode 111b connected to the semiconductor layer 107 through the gate insulating film 108.

In the embodiment, the gate insulating film 108 can be disposed between the source electrode 111a and the drain electrode 111b, and the semiconductor layer 107 to insulate therebetween. According to such a configuration, an interlayer insulating film can be omitted so that a manufacturing process can be simplified and the number of masks can be reduced.

The gate electrode 109 can be disposed below the gate insulating film 108. In addition, the gate insulating film 108 can be disposed below the semiconductor layer 107. The source electrode 111a and the drain electrode 111b can be electrically connected to the semiconductor layer 107 through the gate insulating film 108. In addition, the drain electrode 111b can be electrically connected to a metal pattern 105 through the gate insulating film 108 and insulating layers 104 and 106.

A storage capacitor Cst can maintain a gate-source voltage Vgs of the thin-film transistor TFT during a light emission period of a pixel. As the gate-source voltage Vgs increases, a driving current increases, and accordingly, the amount of light emission of the pixel can increase.

The insulating layers 104 and 106 can include a second insulating layer 106 disposed on the semiconductor layer 107 and a first insulating layer 104 disposed on the second insulating layer 106. The first insulating layer 104 can be made of $SiN_x$ and the second insulating layer 106 can be made of $SiO_2$. The thickness of the second insulating layer 106 can be greater than the thickness of the first insulating layer 104, but the present disclosure is not necessarily limited thereto.

The metal pattern 105 can be disposed on the first insulating layer 104. The metal pattern 105 can be made of APC (an alloy of silver, palladium, and copper), but the present disclosure is not necessarily limited thereto. The metal pattern 105 can perform a function of a reflective layer that reflects light emitted from the light-emitting layer 130 upward. In addition, the metal pattern 105 can perform a function of an anode together with the first electrode 103.

The first electrode 103 can be formed on the insulating layers 104 and 106. Since the first electrode is formed on a rear surface of the thin-film transistor TFT, the first electrode can be formed to have a flat surface.

The first electrode 103 can be made of a transparent electrode material such as indium tin oxide (ITO), indium zinc oxide (IZO), or zinc oxide (ZnO) but is not necessarily limited thereto and can be made of magnesium (Mg), calcium (Ca), aluminum (Al), silver (Ag), or an alloy thereof.

The light-emitting layer 130 can be formed on the first electrode 103. The light-emitting layer 130 can be formed on the rear surface of the thin-film transistor TFT like the first electrode 103 so that the light-emitting layer 130 can be formed to have a flat surface.

The light-emitting layer 130 can include a hole injection layer HIL, a hole transport layer HTL, an active layer EML, an electron transport layer ETL, an electron injection layer EIL, and the like. The structure of a general organic compound layer can be applied to the light-emitting layer 130 without limitation.

The second electrode 140 can be a cathode. The second electrode 140 can be formed entirely on a pixel area to be commonly connected between sub-pixels. The second electrode 140 can be a transparent electrode. As an example, the second electrode 140 can be made of a transparent electrode material such as indium tin oxide (ITO), indium zinc oxide (IZO), or zinc oxide (ZnO), but the present disclosure is not necessarily limited thereto.

A second planarization layer 150 can be formed on the second electrode 140 to planarize an upper surface thereof. The second planarization layer 150 can include an organic material such as polyimide, benzocyclobutene series resin, and acrylate.

A color filter 160 can be disposed on the second planarization layer 150 to control light emitted from each pixel. A line can be electrically connected to a circuit board PAD at the outside of a light-emitting area.

Figure 17:
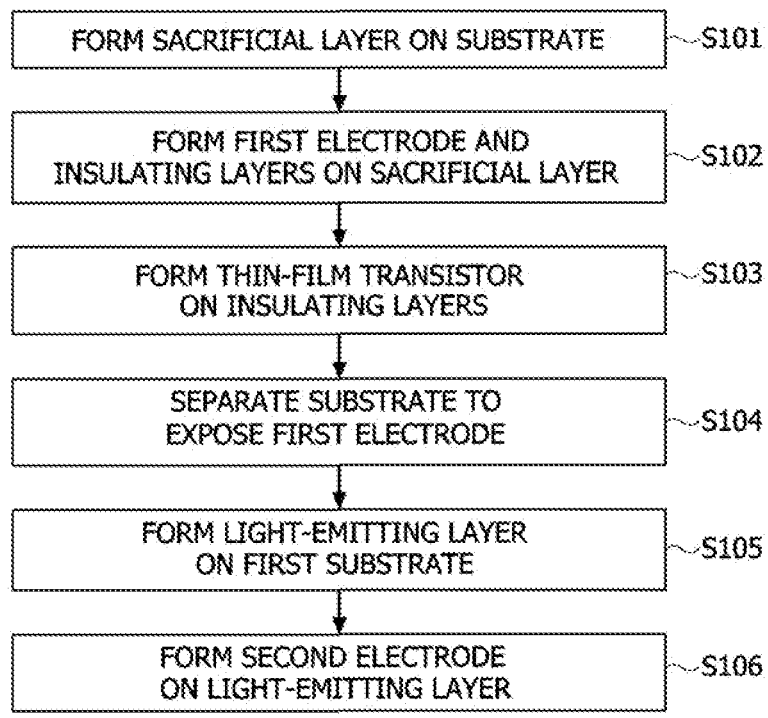
FIG. 17 is a flowchart illustrating a method of manufacturing a display panel according to one embodiment of the present disclosure.

FIG. 17 is a flowchart illustrating a method of manufacturing a display panel according to one embodiment of the present disclosure, and FIGS. 18A to 18I are views for describing the method of manufacturing a display panel according to one embodiment of the present disclosure.

Referring to FIG. 17, the method of manufacturing a display panel according to the embodiment can include forming a sacrificial layer 102 on a first substrate 101 (S101), forming a first electrode 103 and insulating layers 104 and 106 on the sacrificial layer 102 (S102), forming a thin-film transistor TFT on the insulating layers 104 and 106 (S103), separating the substrate 121 to expose the first electrode 103 (S104), forming a light-emitting layer 130 on the first electrode 103 (S105), and forming a second electrode 140 on the light-emitting layer 130 (S106).

Figure 18A:
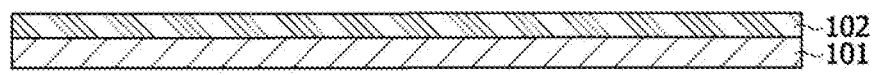
FIGS. 18A to 18I are views for describing the method of manufacturing a display panel according to one embodiment of the present disclosure.

Referring to FIG. 18A, in the operation of forming the sacrificial layer 102 on the first substrate 101 (S101), the sacrificial layer 102 can be formed by repeatedly stacking a $SiN_x$ layer/a $SiO_2$ layer on the first substrate 101 that is a growth substrate. The sacrificial layer 102 can be a layer for removing the first substrate 101 in a process of forming the panel. Thus, the sacrificial layer 102 can be made of a material that can be easily removed by irradiating a laser thereon or wet etching.

The thickness and number of the $SiN_x$ layer and the $SiO_2$ layer are not particularly limited. Further, in addition to the $SiN_x$ layer and the $SiO_2$ layer, materials that have different etch rates and thus can be used for a sacrificial layer can be applied without limitation.

Figure 18B:
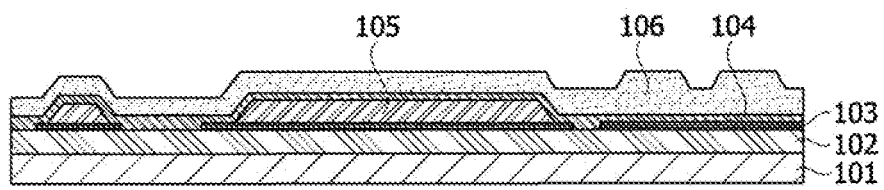

Referring to FIG. 18B, in the operation of forming the first electrode 103 and the insulating layers 104 and 106 on the sacrificial layer 102 (S102), the first electrode 103 can be formed on the sacrificial layer 102, and the first insulating layer 104 can be formed thereon. The first electrode 103 can be formed entirely on the sacrificial layer 102 and can be patterned by removing some sections of the first electrode 103 through patterning.

The first electrode 103 is a transparent electrode and can be formed on the insulating layers 104 and 106. As an example, the first electrode 103 can be made of a transparent electrode material such as indium tin oxide (ITO), indium zinc oxide (IZO), or zinc oxide (ZnO) but is not necessarily limited thereto and can include various metal materials.

At this point, after forming a metal pattern 105 on the first electrode 103, the first insulating layer 104 can be formed. The metal pattern 105 can be made of APC (an alloy of silver, palladium, and copper), but the present disclosure is not necessarily limited thereto. The metal pattern 105 can reflect light emitted from the light-emitting layer upward. The metal pattern 105 can perform a function of an anode together with the first electrode 103.

Thereafter, a second insulating layer 106 can be formed on a first insulating layer 104. The second insulating layer 106 can be formed to be thicker than the first insulating layer 104, but the present disclosure is not necessarily limited thereto. The first insulating layer 104 and the second insulating layer 106 can be made of different materials. As an example, the first insulating layer 104 can be made of SiN and the second insulating layer 106 can be made of $SiO_2$.

Figure 18C:
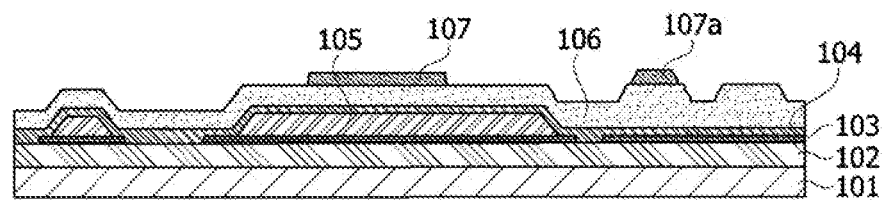

Referring to FIG. 18C, in the operation of forming the thin-film transistor TFT on the insulating layers 104 and 106 (S103), a semiconductor layer 107 can be formed on the insulating layers 104 and 106. A partial area of the semiconductor layer 107 can be formed as a dummy layer 107a. The dummy layer can then form a storage capacitor.

Figure 18D:
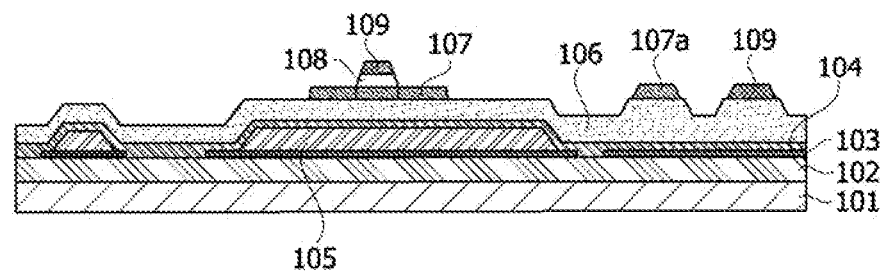

Referring to FIG. 18D, a gate insulating film 108 can be formed by patterning, and then a gate electrode 109 can be formed thereon.

Figure 18E:
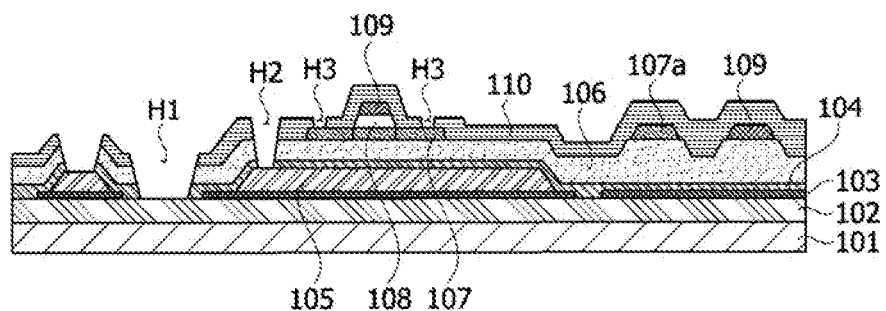

Referring to FIG. 18E, after forming an interlayer insulating film 110, the interlayer insulating film 110 can be partially patterned to form a plurality of through holes H1, H2, and H3. The plurality of through holes can include a first through hole H1 formed at a position not overlapping the first electrode 103 in a vertical direction, and second through holes H2 and H3 formed at a position overlapping the first electrode 103. The second through holes H2 and H3 can expose the semiconductor layer 107 or the metal pattern 105, while the first through hole H1 can expose the sacrificial layer 102. The first through hole H1 can also be formed between a plurality of first electrodes 103.

Figure 18F:
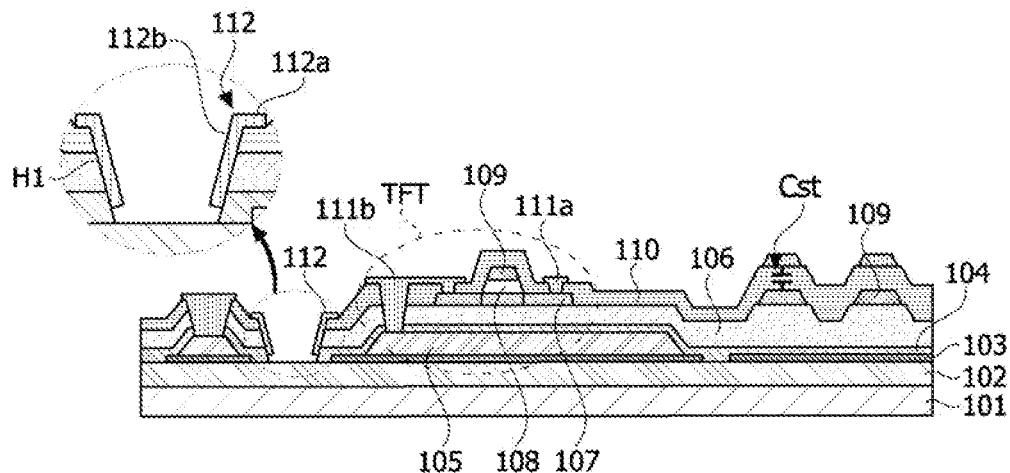

Referring to FIG. 18F, an electrode material can be deposited on the interlayer insulating film 110 to form a source electrode 111a and a drain electrode 111b. An electrode material that fills the second through holes H2 and H3 can form the source electrode 111a and the drain electrode 111b, while an electrode material that fills the first through hole H1 can form a low-potential voltage line 112.

Figure 18G:
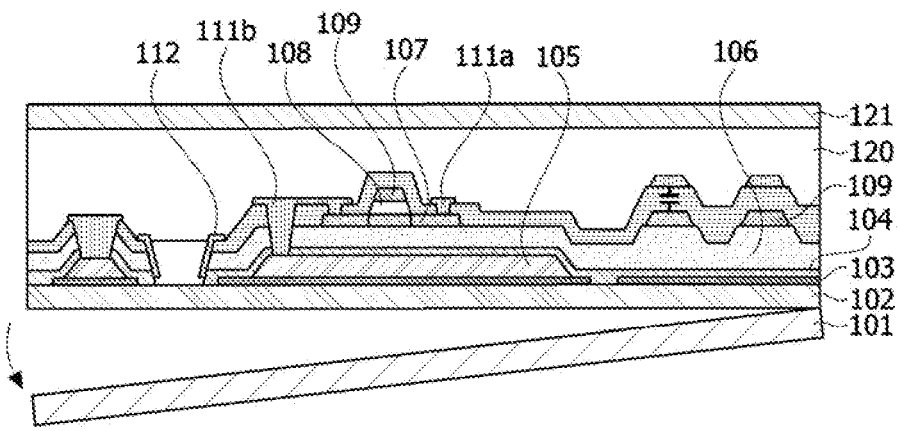

Referring to FIG. 18G, in the operation of separating the first substrate 101 to expose the first electrode 103 (S104), the first substrate 101 can be separated by wet etching. For example, a portion of the sacrificial layer 102 can be removed by wet etching, thereby separating the first substrate 101. The method of wet etching is not particularly limited, and various general etching methods used in a semiconductor process can be applied without limitation. As an example, the first substrate 101 can be separated by irradiating a rear surface thereof with a laser to decompose the sacrificial layer 102.

Figure 18H:
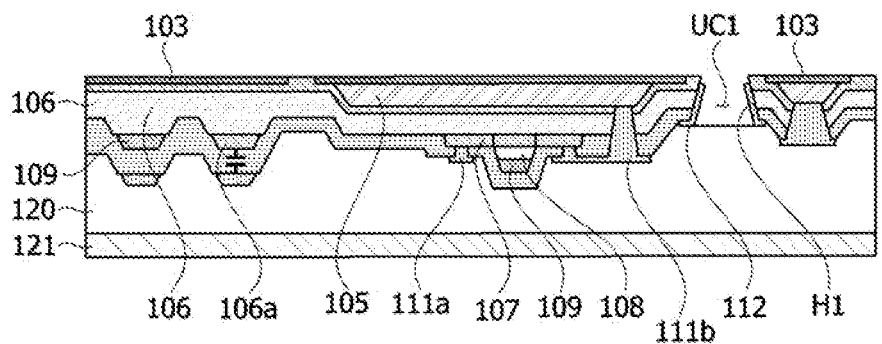

Referring to FIG. 18H, in the operation of forming the light-emitting layer 130 on the first electrode 103 (S105), the remaining sacrificial layer 102 can be removed to expose the first electrode 103. The first electrode 103 and the first insulating layer 104 can be made of a material that is not etched in an etching solution for removing the sacrificial layer 102. The first electrode 103 and the first insulating layer 104 can serve as a stopper configured to stop the etching.

At this point, a first planarization layer 120 exposed to the first through hole H1 can be etched by an etching solution. Thus, the low-potential voltage line 112 formed in the through hole H1 can be exposed to the outside by performing undercut etching UC1 to remove the first planarization layer 120 formed in the through hole H1.

Figure 18I:
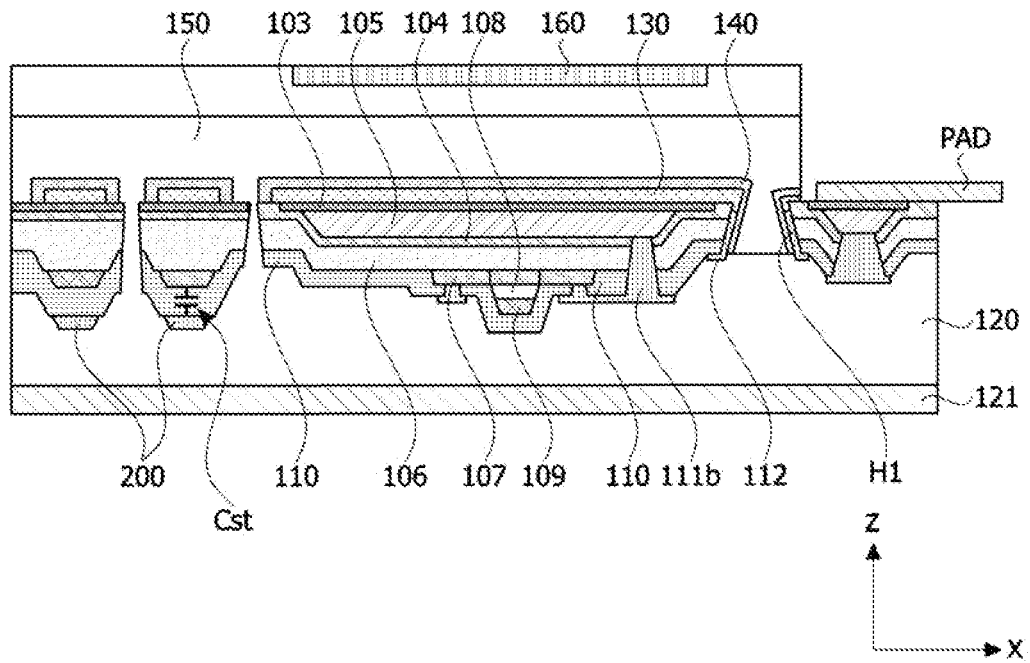

Referring to FIG. 18I, in the operation of forming the second electrode 140 on the light-emitting layer 130, the light-emitting layer 130 and the second electrode 140 can be sequentially formed on the exposed first electrode 103. The light-emitting layer 130 can form various sub-pixels according to a pixel configuration. As the method of forming the light-emitting layer 130, various methods of depositing an organic light-emitting diode can be applied without limitation.

Thereafter, the second electrode 140 can be formed on the entire area of the plurality of sub-pixels. In this process, a portion of the second electrode 140 can be filled in the through hole H1 to be electrically connected to the low-potential voltage line 112. Thereafter, a second planarization layer 150 can be formed on the second electrode 140, and a color filter 160 can be formed. A portion of the second planarization layer 150 can be filled in the first through hole H1.

FIGS. 19A to 19H are views for describing a method of manufacturing a display panel according to another embodiment of the present disclosure.

Figure 19A:
FIGS. 19A to 19H are views for describing a method of manufacturing a display panel according to another embodiment of the present disclosure.

Referring to FIG. 19A, in forming a sacrificial layer 102 on a first substrate 101, the sacrificial layer 102 can be formed by repeatedly stacking a $SiN_x$ layer/a $SiO_2$ layer on a glass substrate. The sacrificial layer 102 can be a layer for removing the first substrate 101 in a process of forming the panel. This, the sacrificial layer 102 can be made of a material that can be easily removed by irradiating a laser thereon or wet etching.

The thickness and number of the $SiN_x$ layer and the $SiO_2$ layer are not particularly limited. Further, in addition to the $SiN_x$ layer and the $SiO_2$ layer, materials that have different etch rates and thus can be used for the sacrificial layer 102 can be applied without limitation.

Figure 19B:
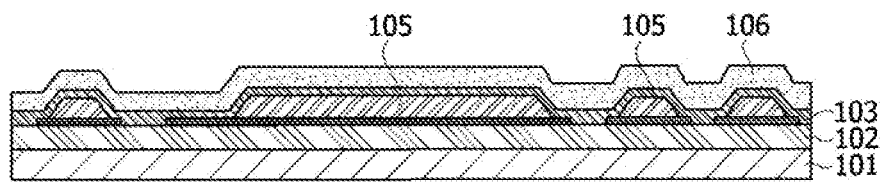

Referring to FIG. 19B, in forming a first electrode 103 and insulating layers 104 and 106 on the sacrificial layer 102, the first electrode 103 can be formed on the sacrificial layer 102, and a first insulating layer 104 can be formed thereon. The first electrode 103 can be formed entirely on the sacrificial layer 102 and can be patterned by removing some sections of the first electrode 103 through patterning.

The first electrode 103 can be formed on the insulating layers 104 and 106 as a transparent electrode. As an example, the first electrode 103 can be made of a transparent electrode material such as indium tin oxide (ITO), indium zinc oxide (IZO), or zinc oxide (ZnO) but is not necessarily limited thereto and can include various metal materials.

At this point, after forming a metal pattern 105 on the first electrode 103, the first insulating layer 104 can be formed. The metal pattern 105 can be made of APC (an alloy of silver, palladium, and copper), but the present disclosure is not necessarily limited thereto. The metal pattern 105 can reflect light emitted from the light-emitting layer. The metal pattern 105 can perform a function of an anode together with the first electrode 103.

Thereafter, a second insulating layer 106 can be formed on the first insulating layer 104. The second insulating layer 106 can be formed to be thicker than the first insulating layer 104, but the present disclosure is not necessarily limited thereto. Materials of the first insulating layer 104 and the second insulating layer 106 can be different. As an example, the first insulating layer 104 can be SiN and the second insulating layer 106 can be $SiO_2$.

Figure 19C:
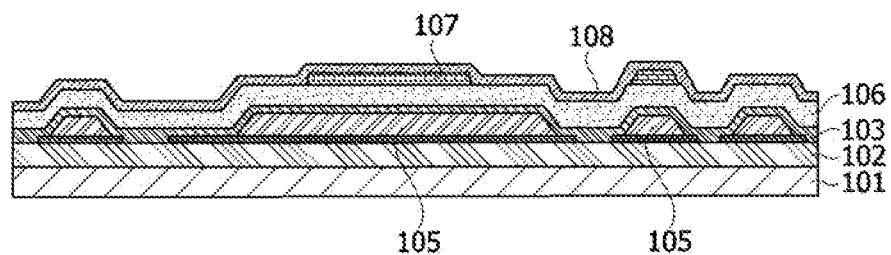

Referring to FIG. 19C, in forming a thin-film transistor TFT on the insulating layers 104 and 106, a semiconductor layer 107 can be formed on the insulating layers 104 and 106. A partial area of the semiconductor layer 107 can be formed as a dummy layer. Afterward, the dummy layer can form a storage capacitor. A gate insulating film 108 can be formed entirely on the insulating layers 104 and 106.

Figure 19D:
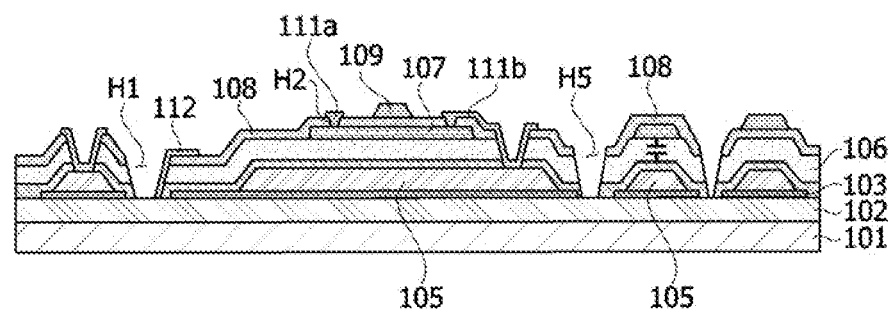

Referring to FIG. 19D, the gate insulating film 108 can be patterned to form a plurality of through holes including a first through hole H1, a second through hole H2, and a third through hole H5. The first through hole H1 and the third through hole H5 can be formed at a position not overlapping the first electrode 103 in a vertical direction to expose the sacrificial layer 102. The third through hole H5 can be formed between a plurality of first electrodes 103.

The plurality of electrodes can be formed by depositing an electrode material on the gate insulating film 108 having the plurality of through holes formed therein. Specifically, a gate electrode 109 can be formed on the gate insulating film 108, a source electrode 111a and a drain electrode 111b can be formed in the second through hole H2, and a low-potential voltage line 112 can be formed in the first through hole H1. In addition, a blocking layer (see FIGS. 13, 14A, and 14B) can be formed by filling the third through hole H5 with an electrode material.

Figure 19E:
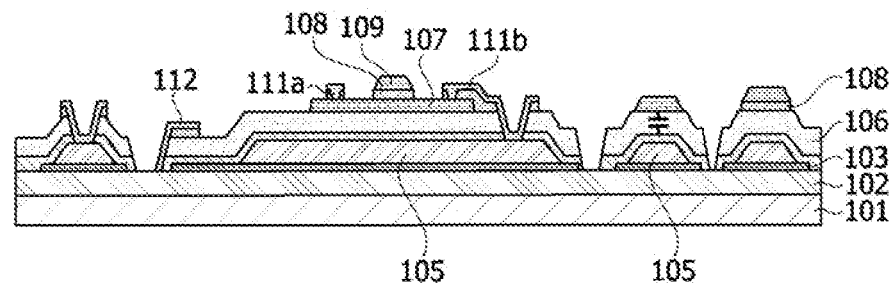

Referring to FIG. 19E, the gate insulating film 108 can be removed in an area other than an area in which the gate electrode 109, the source electrode 111a, and the drain electrode 111b are formed. According to such a configuration, a process of forming an interlayer insulating film can be omitted so that the number of masks can be reduced.

Figure 19F:
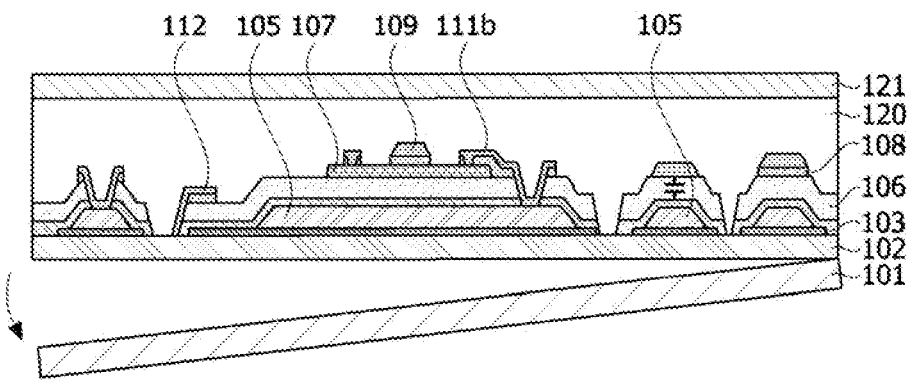

Referring to FIG. 19F, in separating the first substrate 101 to expose the first electrode 103, the first substrate 101 can be separated by wet etching. For example, a portion of the sacrificial layer 102 can be removed by wet etching, thereby separating the first substrate 101. The method of wet etching is not particularly limited, and various general etching methods used in a semiconductor process can be applied without limitation.

Figure 19G:
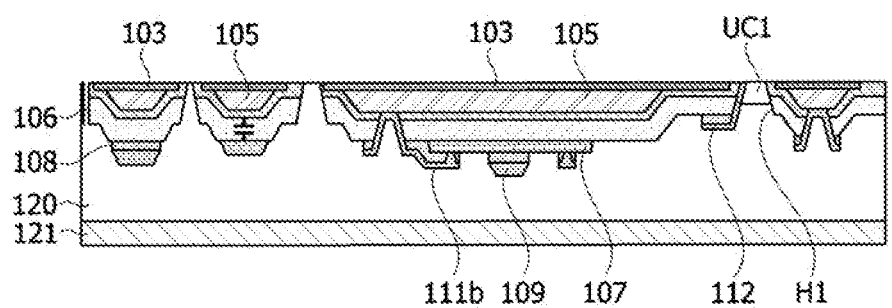

Referring to FIG. 19G, in forming a light-emitting layer 130 on the first electrode 103, the remaining sacrificial layer 102 can be removed to expose the first electrode 103. The first electrode 103 and the first insulating layer 104 can be made of a material that is not etched in an etching solution for removing the sacrificial layer 102. A first planarization layer 120 exposed to the first through hole H1 can be etched by an etching solution. The low-potential voltage line 112 formed in the through hole H1 can be exposed to the outside by performing undercut etching UC1 to remove the first planarization layer 120 formed in the through hole H1.

Figure 19H:
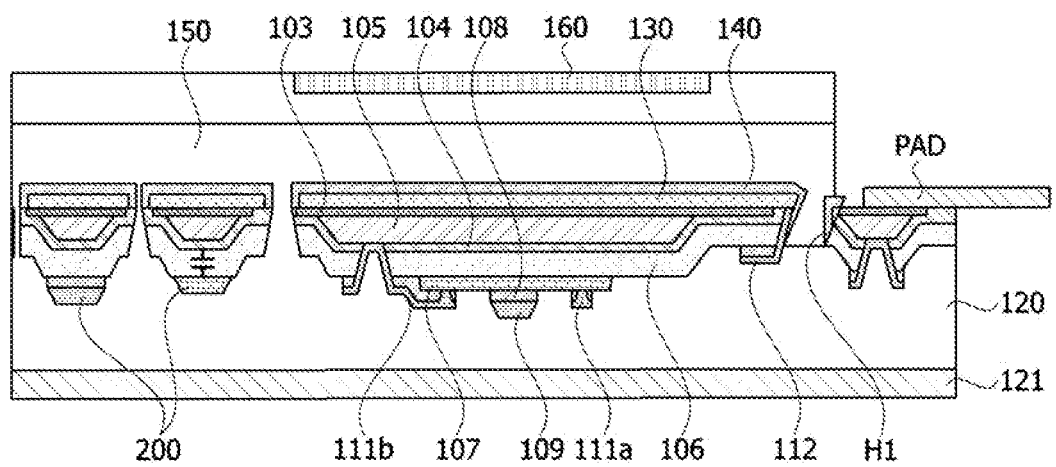

Referring to FIG. 19H, in forming a second electrode 140 on the light-emitting layer 130, the light-emitting layer 130 can be formed on the exposed first substrate 101. The light-emitting layer 130 can form various sub-pixels according to a pixel configuration. As the method of forming the light-emitting layer 130, various methods of depositing an organic light-emitting diode can be applied without limitation.

Thereafter, the second electrode 140 can be formed on the entire area of the plurality of sub-pixels. In this process, a portion of the second electrode 140 can be filled in the first through hole H1 to be electrically connected to the low-potential voltage line 112. Thereafter, a second planarization layer 150 can be formed on the second electrode 140, and a color filter 160 can be formed.

According to one or more embodiments of the present disclosure, an aperture ratio of pixels can be increased.

Further, according to one or more embodiments of the present disclosure, an afterimage can be removed and power consumption can be reduced. In addition, high-resolution pixels can be designed without improving the performance of an exposure apparatus.

Furthermore, according to one or more embodiments of the present disclosure, the number of masks can be reduced during manufacture. Also, electrical connection reliability between a cathode and a low-potential voltage line can be improved.

Effects of the present disclosure will not be limited to the above-mentioned effects and other unmentioned effects will be clearly understood by those skilled in the art from the following claims.

While the embodiments of the present disclosure have been described in detail above with reference to the accompanying drawings, the present disclosure is not necessarily limited to these embodiments, and various changes and modifications can be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments.

Therefore, the above-described embodiments should be understood to be exemplary and not limiting in any aspect. The scope of the present disclosure should be construed by the appended claims, and all technical spirits within the scope of their equivalents should be construed as being included in the scope of the present disclosure.

What is claimed is:

1. A display device comprising:
a substrate;
a planarization layer disposed on the substrate,
a gate electrode disposed on the planarization layer;
a gate insulating film disposed on the gate electrode;
a semiconductor layer disposed on the gate insulating film;
an insulating layer disposed on the semiconductor layer;
a first electrode disposed on the insulating layer;
a light-emitting layer disposed on the first electrode; and
a second electrode disposed on the light-emitting layer,
wherein the insulating layer includes a through hole having an inner side wall to which a low-potential voltage line extends,
wherein the second electrode extends to the through hole and is electrically connected to the low-potential voltage line, and
wherein the planarization layer includes a protrusion inserted into the through hole.

2. The display device of claim 1, wherein the low-potential voltage line includes:
a first line area disposed on a lower surface of the insulating layer, and
a second line area extending to the inner side wall of the through hole.

3. The display device of claim 2, wherein the second electrode extends to the inner side wall of the through hole and is electrically connected to the second line area of the low-potential voltage line.

4. The display device of claim 1, wherein the light-emitting layer includes an extending portion extending to the inner side wall of the through hole.

5. The display device of claim 1, further comprising:
a metal pattern disposed between the first electrode and the semiconductor layer, wherein the metal pattern is electrically connected to the first electrode.

6. A display device comprising:
a gate electrode;
a gate insulating film disposed on the gate electrode;
a semiconductor layer disposed on the gate insulating film;
an insulating layer disposed on the semiconductor layer;
a first electrode disposed on the insulating layer;
a light-emitting layer disposed on the first electrode; and
a second electrode disposed on the light-emitting layer,
wherein the first electrode includes a plurality of first electrodes respectively corresponding to a plurality of sub-pixels, wherein the insulating layer includes a plurality of sub-through holes disposed between the plurality of first electrodes, wherein the plurality of sub-through holes are disposed in a length direction of the plurality of first electrodes, wherein a blocking layer is disposed in the plurality of sub-through holes, and wherein the blocking layer is a dummy line of a low-potential voltage line.

7. The display device of claim 1, further comprising:

an interlayer insulating film disposed below the insulating layer;

a metal pattern disposed between the insulating layer and the first electrode; and a source electrode and a drain electrode disposed below the interlayer insulating film, wherein the drain electrode is electrically connected to the metal pattern through the insulating layer and the interlayer insulating film.

8. The display device of claim 1, further comprising:

a metal pattern disposed between the insulating layer and the first electrode; and a source electrode and a drain electrode disposed below the gate insulating film, wherein the drain electrode is electrically connected to the metal pattern through the insulating layer and the gate insulating film.

* * * * *